US012813230B2

(12) United States Patent
Huang et al.

(10) Patent No.: US 12,813,230 B2
(45) Date of Patent: Nov. 24, 2026

(54) SEMICONDUCTOR DEVICE STRUCTURES AND METHODS OF FORMING THE SAME

(71) Applicant: TAIWAN SEMICONDUCTOR MANUFACTURING COMPANY, LTD., Hsinchu (TW)

(72) Inventors: Kuan-Da Huang, Hsinchu (TW); Peng-Hsuan Chiang, Hsinchu (TW); Li-Te Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 346 days.

(21) Appl. No.: 18/404,429

(22) Filed: Jan. 4, 2024

(65) Prior Publication Data

US 2025/0226219 A1 Jul. 10, 2025

(51) Int. Cl.

*H10P 76/20* (2026.01)
*H10D 30/01* (2025.01)
*H10D 30/43* (2025.01)
*H10D 30/67* (2025.01)
*H10D 62/10* (2025.01)
(Continued)

(52) U.S. Cl.

CPC ....... *H10P 76/2041* (2026.01); *H10D 30/014* (2025.01); *H10D 30/43* (2025.01); *H10D 30/6735* (2025.01); *H10D 30/6757* (2025.01); *H10D 62/121* (2025.01); *H10D 62/151* (2025.01); *H10D 64/017* (2025.01);
(Continued)

(58) Field of Classification Search

CPC ............... H10P 76/2041; H10P 50/695; H10D 30/014; H10D 30/43; H10D 30/6735; H10D 30/6757; H10D 62/121; H10D 62/151; H10D 64/017; H10D 84/013; H10D 84/038; H10D 84/83; H10D 84/8312; H10D 30/019; H10D 30/501; H10D 84/0128; H10D 84/0133; H10D 84/8311; H10D 84/83125; H10D 84/832

See application file for complete search history.

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

CN 115132722 A 9/2022
TW 202308171 A 2/2023

*Primary Examiner* — Tan N Tran
(74) *Attorney, Agent, or Firm* — NZ Carr Law Office

(57) ABSTRACT

Embodiments of the present disclosure provide semiconductor device structures and methods of forming the same. The method includes forming a stack of semiconductor layers on a substrate, depositing a hard mask over the stack of semiconductor layers, forming, over the hard mask, a first photoresist layer that defines first openings that expose portions of the hard mask that are to be etched, etching the portions of the hard mask to form a hard mask fin structure, forming, over a first portion of the hard mask fin structure, a second photoresist layer that defines a second opening that exposes a second portion of the hard mask fin structure that is to be etched, etching the second portion of the hard mask fin structure to form a modified hard mask fin structure, and etching portions of the stack of semiconductor layers to form a fin structure.

16 Claims, 22 Drawing Sheets

(51) Int. Cl.

| | |
|---|---|
| ***H10D 62/13*** | (2025.01) |
| ***H10D 64/01*** | (2025.01) |
| ***H10D 84/01*** | (2025.01) |
| ***H10D 84/03*** | (2025.01) |
| ***H10D 84/83*** | (2025.01) |
| ***H10P 50/00*** | (2026.01) |

(52) U.S. Cl.
CPC ......... *H10D 84/013* (2025.01); *H10D 84/038* (2025.01); *H10D 84/83* (2025.01); *H10P 50/695* (2026.01)

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 10,964,801 | B2 * | 3/2021 | Li | H10B 12/056 |
| 11,749,733 | B2 * | 9/2023 | Guler | H10D 30/024<br>257/365 |
| 2023/0378304 | A1 | 11/2023 | Lin et al. | |

* cited by examiner

SEMICONDUCTOR DEVICE STRUCTURES AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
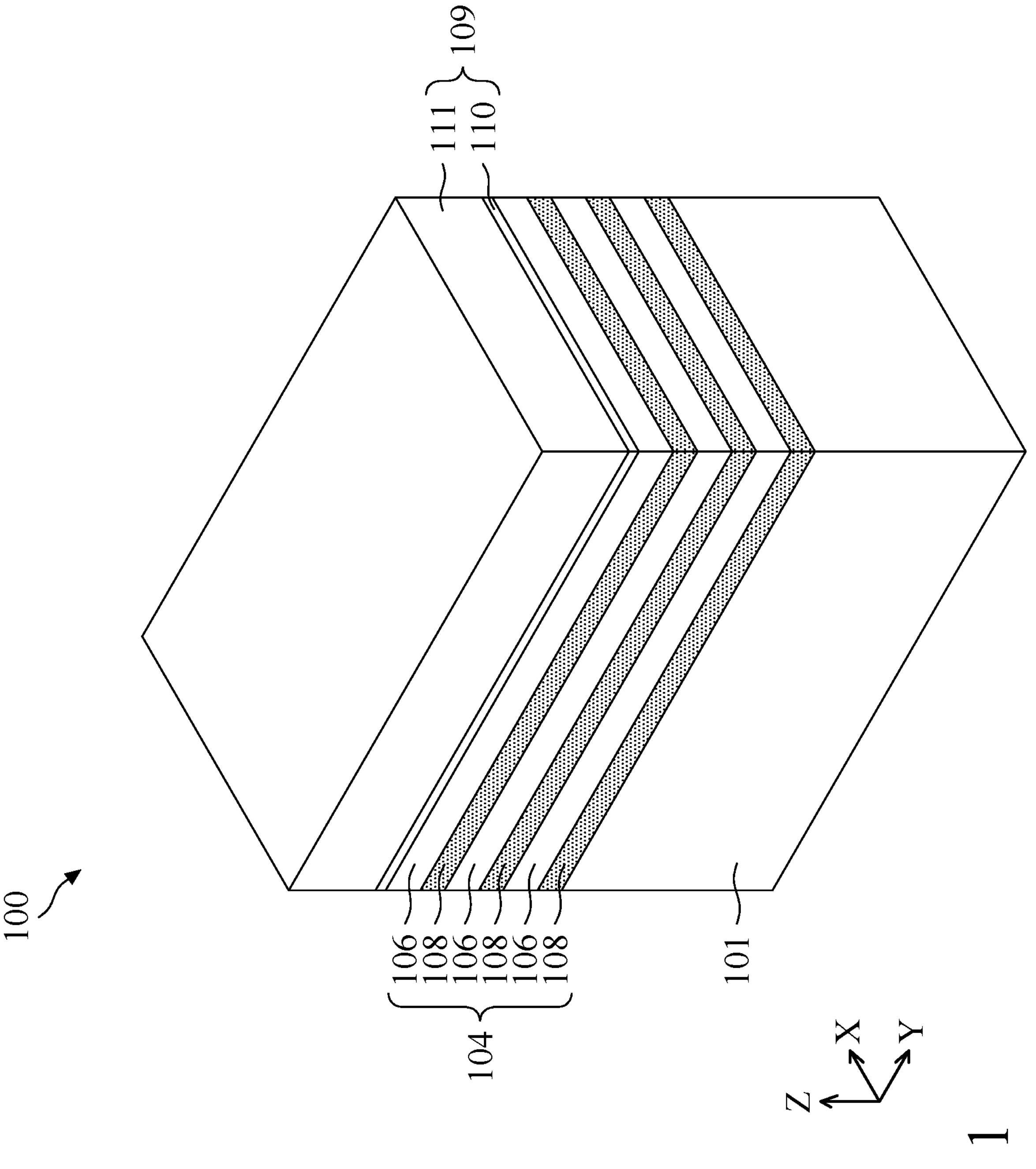
FIGS. 1-16B are views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanostructure channel FETs, such as gate all around (GAA) FETs, for example Horizontal Gate All Around (HGAA) FETs or Vertical Gate All Around (VGAA) FETs, implementations of some aspects of the present disclosure may be used in other processes and/or in other devices, such as FinFETs and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure provide semiconductor device structures and methods of forming the same. A problem exists in the semiconductor IC industry associated with changes in width of an active region, such as a fin structure. In some embodiments, the term "active region" discussed in the present disclosure is also referred to as an oxide definition (OD) region. For example, the OD width transition along a longitudinal direction (which also may be referred to herein as "OD jog rounding") is too gradual and not sharp enough. If the gradual transition of OD width extends from one gate to a neighboring gate, the slant portion may cause dielectric spacers to peel off, which in turn may lead to gate leakage. Furthermore, the gradual transition of OD width creates non-active transition regions that cannot be used for active features (e.g., via continuous poly on oxide definition (CPODE) process, which is to remove the portion having the gradual transition of OD width). Also, OD jog rounding can limit flexible sheet width via design technology co-optimization (DTCO). OD jog rounding may be limited by lithography and etching processes (e.g., too low resolution of lithography techniques and/or plasma damage that induces pattern distortion). For example, photoresist curing and/or reflow can reduce line width roughness (LWR) and/or line edge roughness (LER). These problems are characteristic of methods in which the OD width and jog are defined at the same time (e.g., with a single photoresist) (which also may be referred to herein as "jog first approach").

In some embodiments of the present disclosure, OD jog rounding is able to match scaling of transistor gate pitch, or contacted poly pitch (CPP), which is a measurement of the pitch between two parallel gates, as described in more detail below. In other words, as CPP is scaled down (reduced), OD jog rounding can decrease by a corresponding amount that enables the OD jog to fit between two neighboring gates. Without needing to cut the transition regions (e.g., via CPODE), the area of active regions is increased. Also, improved control of OD width in specific regions can reduce power consumption of transistors. Also, ability for fin portions, crossing the active region, to be straight and not slanted prevents problems with dielectric spacer peeling off and gate leakage. The foregoing benefits are realized via the semiconductor device structures and methods described below. For example, methods in which the OD width and jog are defined at different stages of the manufacturing process (e.g., with multiple photoresists) (which also may be referred to herein as "jog last approach") are able to address the various problems stated above.

FIGS. 1 to 16B show exemplary processes for manufacturing a semiconductor device structure 100 according to embodiments of the present disclosure. It is understood that additional operations can be provided before, during, and after processes shown by FIGS. 1 to 16, and some of the operations described below can be replaced or eliminated, for additional embodiments of the method. The order of the operations/processes is not limiting and may be interchangeable.

FIG. 1 is a perspective view of a stage of manufacturing a semiconductor device structure 100, in accordance with some embodiments. As shown in FIG. 1, a semiconductor device structure 100 includes a stack of semiconductor layers 104 formed over a front side of a substrate 101. The substrate 101 may be a semiconductor substrate. The substrate 101 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type conductivity). Depending on circuit design, the dopants may be, for example phosphorus for an n-type field effect transistors (NFET) and boron for a p-type field effect transistors (PFET).

The stack of semiconductor layers 104 includes alternating semiconductor layers made of different materials to facilitate formation of nanostructure channels in a multi-gate device, such as nanostructure channel FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The first semiconductor layers 106 or portions thereof may form nanostructure channel(s) of the semiconductor device structure 100 in later fabrication stages. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanostructure channel(s) of the semiconductor device structure 100 may be surrounded by a gate electrode. The semiconductor device structure 100 may include a nanostructure transistor. The nanostructure transistors may be referred to as nanosheet transistors, nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. Three first semiconductor layers 106 and three second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104, and the number of layers depending on the predetermined number of channels for the semiconductor device structure 100. As shown in FIG. 1, a hard mask 109 is formed on the topmost first semiconductor layer 106. For example, the hard mask 109 may include an oxide layer 110 that is formed on the topmost first semiconductor layer 106 and a nitride layer 111 that is formed on the oxide layer 110. The oxide layer 110 may be silicon oxide and may have different etch selectivity compared to the nitride layer 111. The nitride layer 111 may include any suitable nitride material, such as silicon nitride. In some other embodiments, the hard mask 109 may include one or more layers formed from silicon, nitride, oxide, dielectrics, metal, metal oxides, other suitable materials, and/or combinations thereof.

Figure 2B:
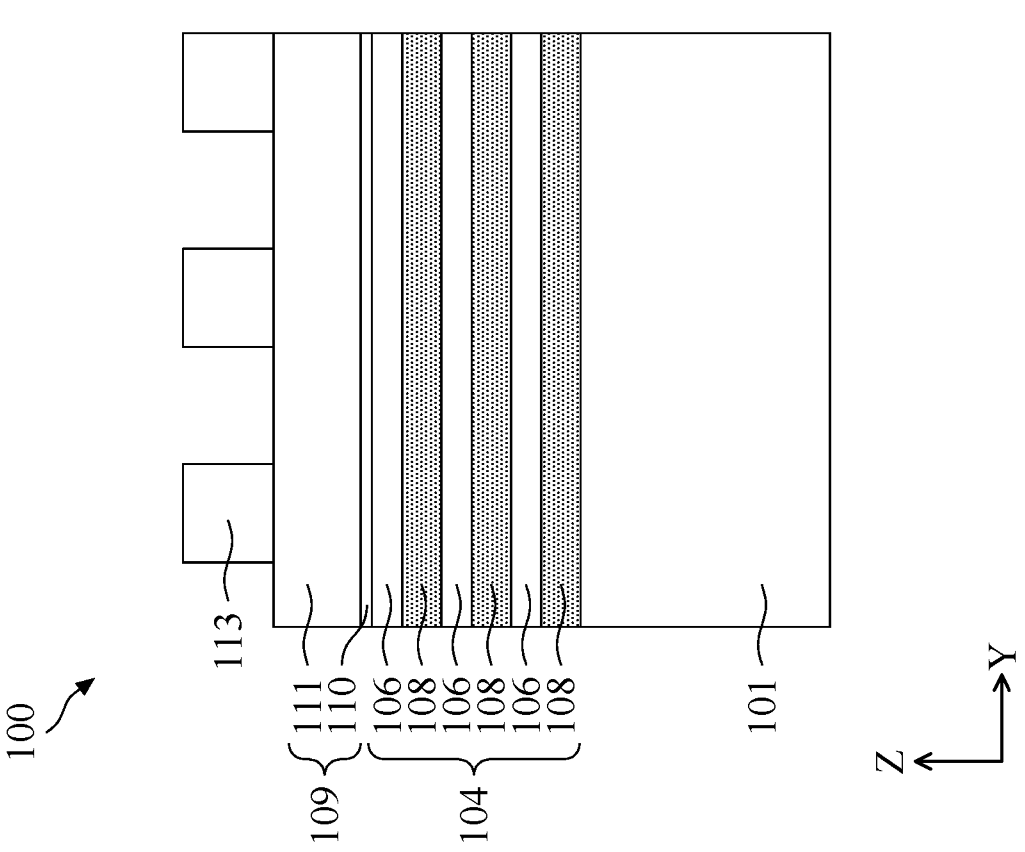
Figure 2A:
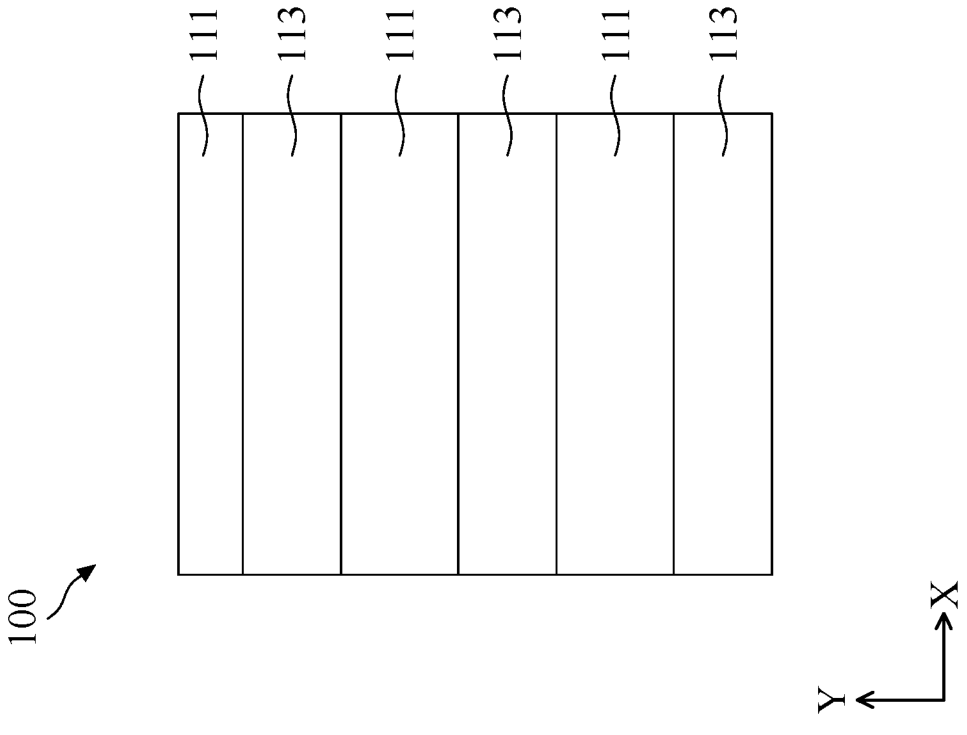

FIGS. 2A-2B are top and side views, respectively, of another stage of manufacturing the semiconductor device structure 100, in accordance with some embodiments. In FIGS. 2A-2B, a first photoresist layer 113 is formed over the hard mask 109 (e.g., over the nitride layer 111 of the hard mask 109). The first photoresist layer 113 is configured (e.g., via a photolithography process) to define a first pattern that is to be transferred to the hard mask 109 (e.g., to define a width of the hard mask 109 in the Y direction that corresponds to the width of an OD region, without defining a jog (e.g., a change in the width) of the hard mask 109). The photo-lithography process may include forming the first photoresist layer 113 over the hard mask 109, exposing the first photoresist layer 113 to a pattern, performing post-exposure bake processes, and developing the first photoresist layer 113 to form a masking element including the first photoresist layer 113. In some embodiments, patterning the first photoresist layer 113 to form the masking element may be performed using an electron beam (e-beam) lithography process. As illustrated in FIGS. 2A-2B, the first photoresist layer 113 is a patterned photoresist layer, or patterned mask, that defines openings that correspond to portions of the hard mask 109 that are to be etched.

Figure 3:
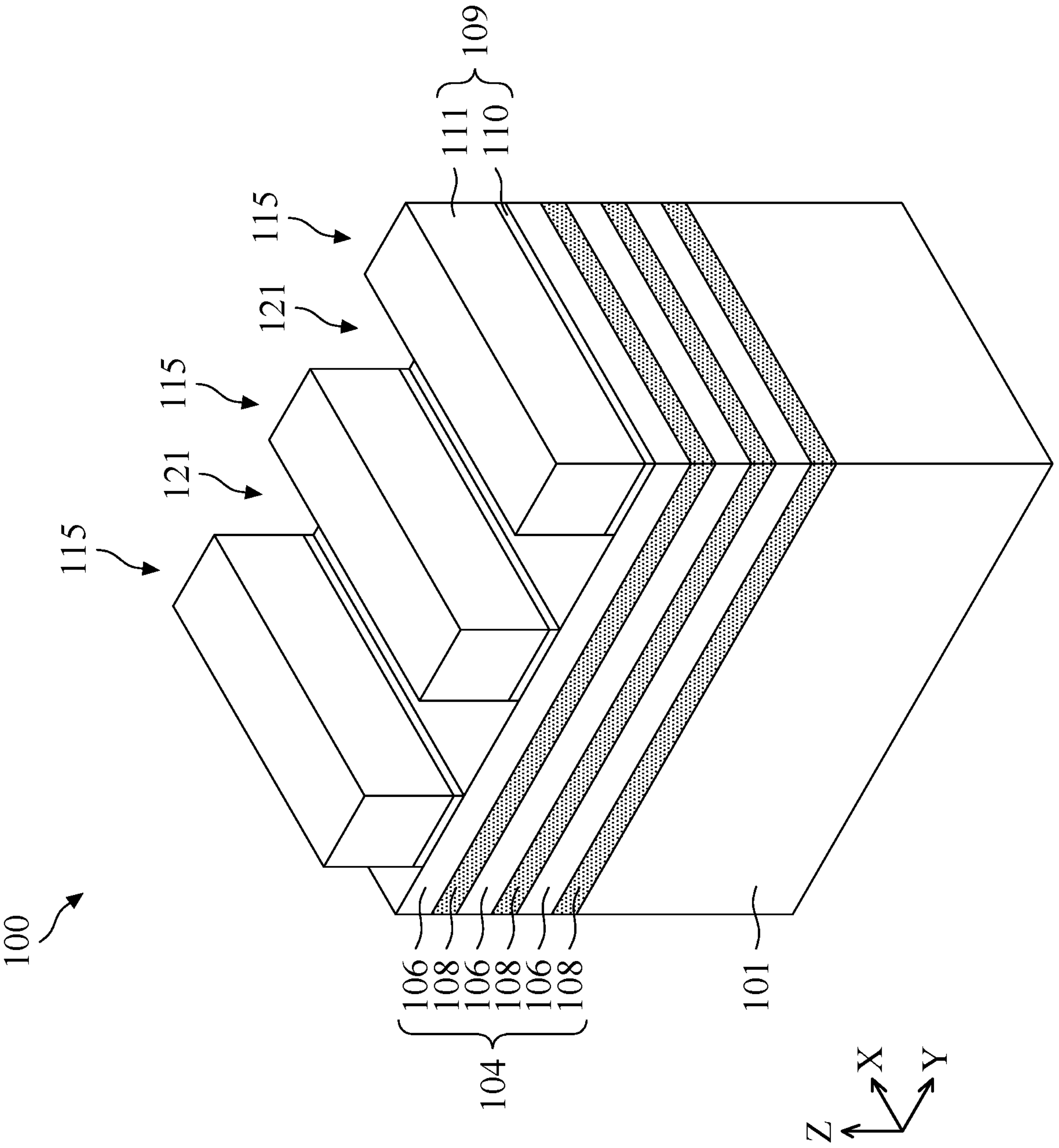

FIG. 3 is a perspective view of another stage of manufacturing the semiconductor device structure 100, in accordance with some embodiments. In FIG. 3, the first pattern of the first photoresist layer 113 is transferred to the hard mask 109 to define hard mask fin structures 115. The hard mask fin structures 115 may be formed using multi-patterning operations including photo-lithography (FIGS. 2A-2B) and etching processes. In some embodiments, the etching process may include etching both the oxide layer 110 and the nitride layer 111 to expose the topmost first semiconductor layer 106. In some other embodiments, the etching process may include etching only the nitride layer 111 such that the oxide layer 110 is exposed and the topmost first semiconductor layer 106 is not exposed. The etching process includes etching, or trimming, unprotected portions of the hard mask 109 to define the hard mask fin structures 115 separated by hard mask trenches 121. As illustrated in FIG. 3, the hard mask fin structures 115 and the hard mask trenches 121 extend lengthwise in the X-direction. In some embodiments, the etching processes described herein may include plasma etching, dry etching, wet etching, reactive ion etching (RIE), and/or other suitable processes, or combinations thereof. When plasma etching is used, the plasma type may include inductively coupled plasma (ICP), capacitively coupled plasma (CCP), electron cyclotron resonance (ECR) plasma, other suitable plasma types, and/or combinations thereof. In some embodiments, the etching gas may include fluorine, chlorine, bromine, other suitable etching gases, and/or combinations thereof. In some embodiments, the etching process temperature may be within a range from about 50° C. to about 350° C. In some embodiments, the etching process pressure may be within a range from about 1 mTorr to about 10 Torr. In some embodiments, the source power may be within a range from about 50 W to about 1200 W. In some embodiments, the source power frequency may be within a range from about 13.56 MHZ or greater. In some embodiments, the bias power may be within a range from about 0 V to about 1200 V. In some embodiments, the bias power frequency may be within a range from about 13.56 MHz or less. The first photoresist layer 113 is removed after the formation of the hard mask fin structures 115.

Figure 4B:
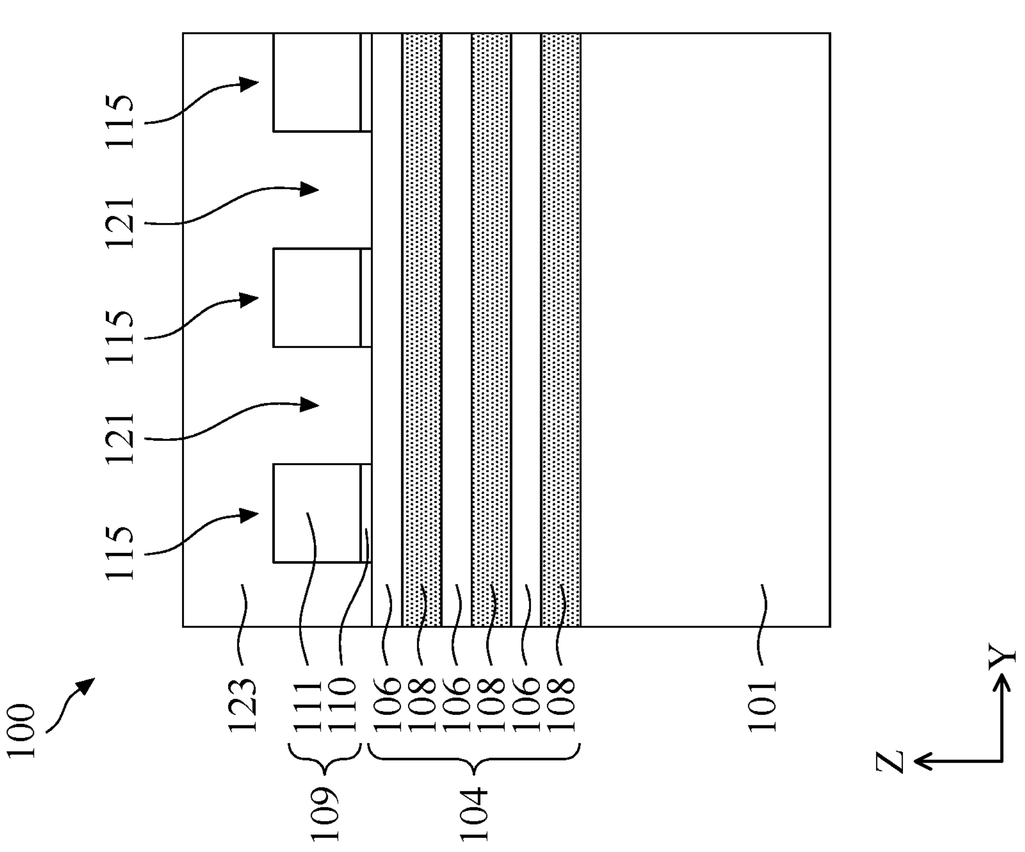
Figure 4A:
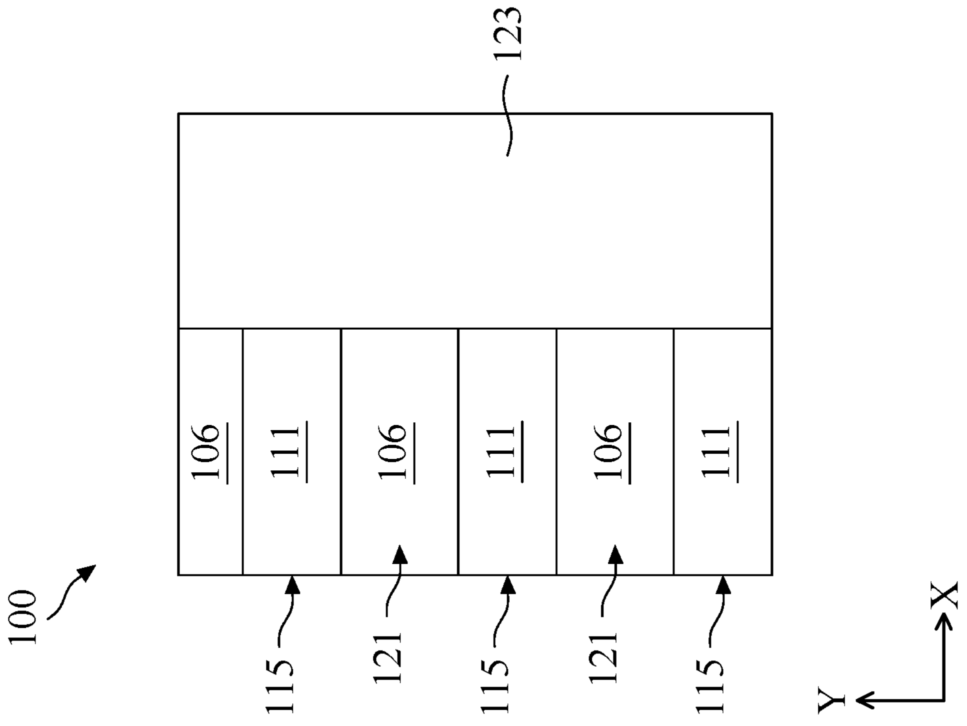

FIGS. 4A-4B are top and side views, respectively, of another stage of manufacturing the semiconductor device structure 100, in accordance with some embodiments. In FIGS. 4A-4B, a second photoresist layer 123 is formed over the hard mask fin structures 115 and over the hard mask trenches 121 (e.g., over a top surface of the hard mask 109 of the hard mask fin structures 115 and over the topmost first semiconductor layer 106 that was exposed via the etching process that formed the hard mask trenches 121 as illustrated in FIG. 3). The second photoresist layer 123 is configured (e.g., via a photolithography process) to define a second pattern that is to be transferred to remaining portions of the hard mask 109 (e.g., to define a jog (e.g., a change in the width of the hard mask 109 in the Y-direction) that delineates a first portion of the hard mask fin structures 115 that are to be etched from a second portion of the hard mask fin structures 115 that are not to be etched. The photo-lithography process may include forming the second photoresist layer 123 over the hard mask fin structures 115, exposing the second photoresist layer 123 to a pattern, performing post-exposure bake processes, and developing the second photoresist layer 123 to form a masking element including the second photoresist layer 123. In some embodiments, patterning the second photoresist layer 123 to form the masking element may be performed using an e-beam lithography process. As illustrated in FIGS. 4A-4B, the second photoresist layer 123 is a patterned photoresist layer, or patterned mask, that defines an opening that corresponds to portions of the hard mask fin structures 115 that are to be etched.

Figure 5A:
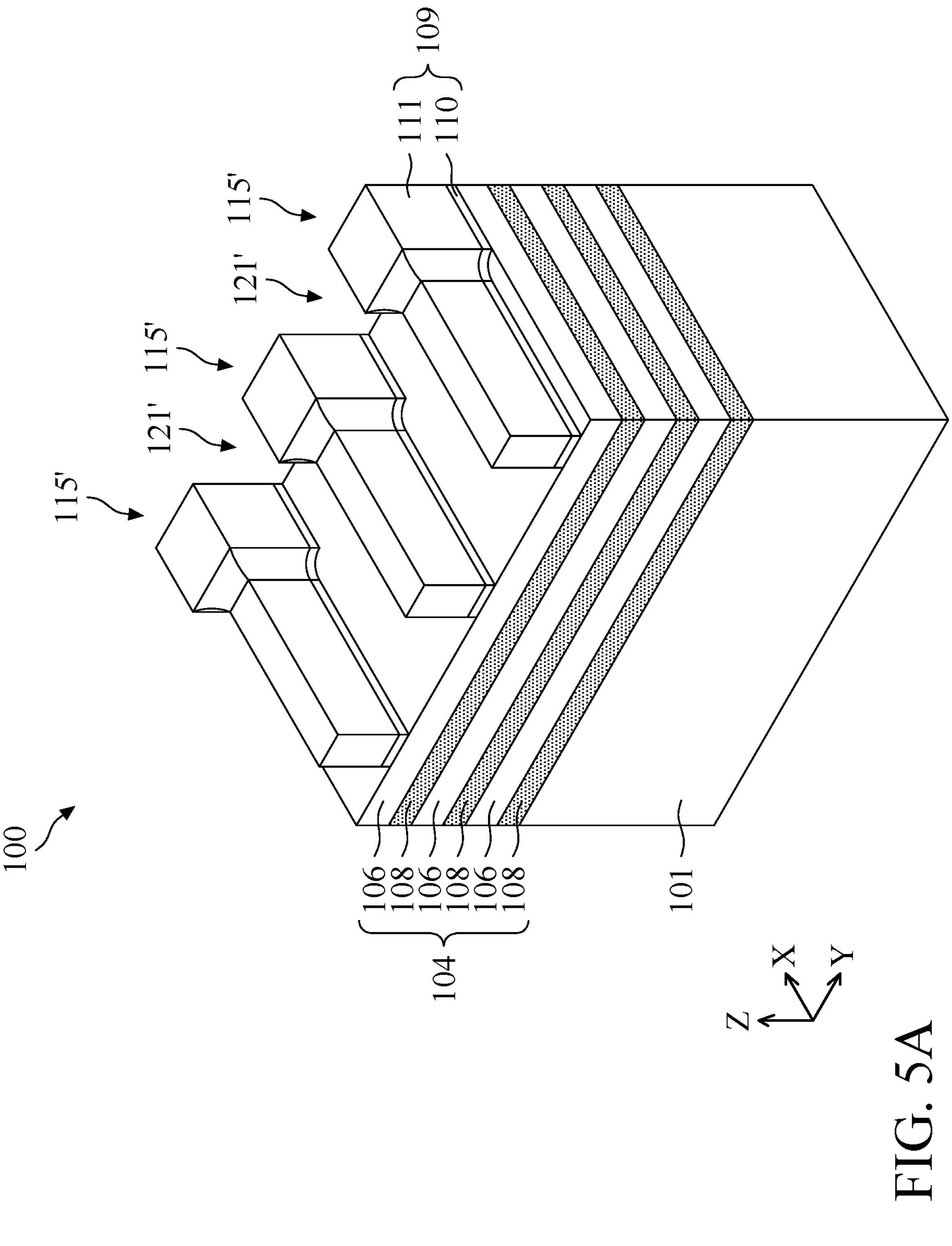
Figure 5C:
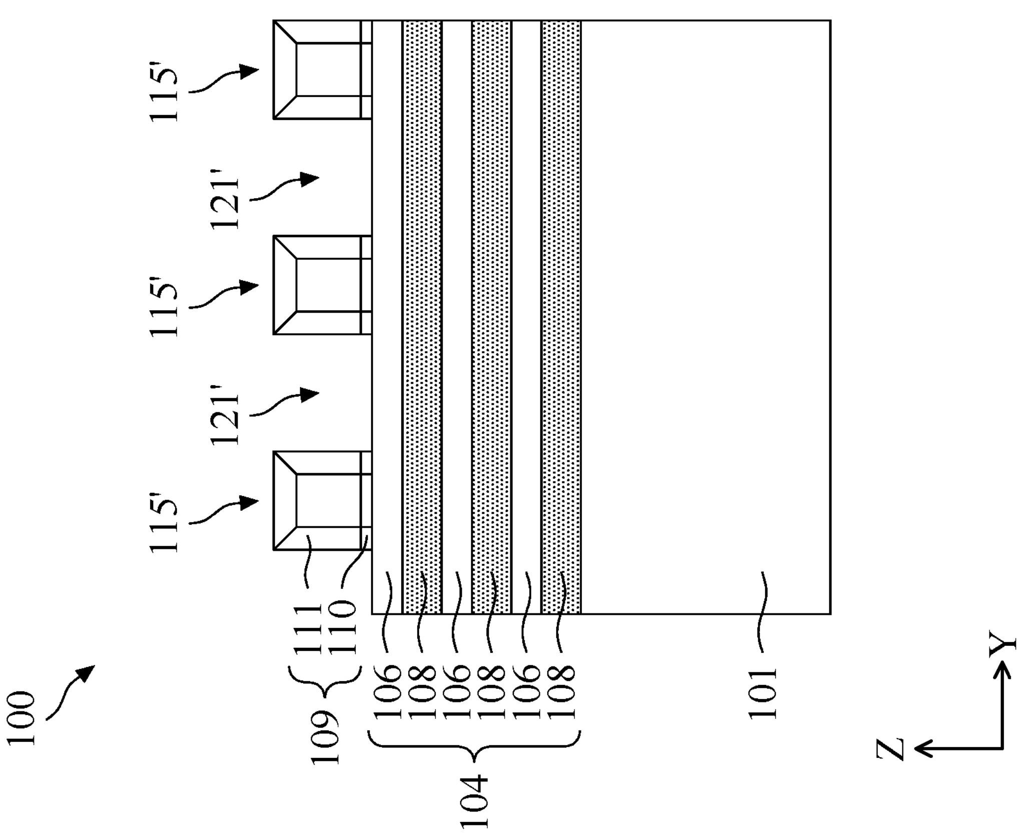
Figure 5B:
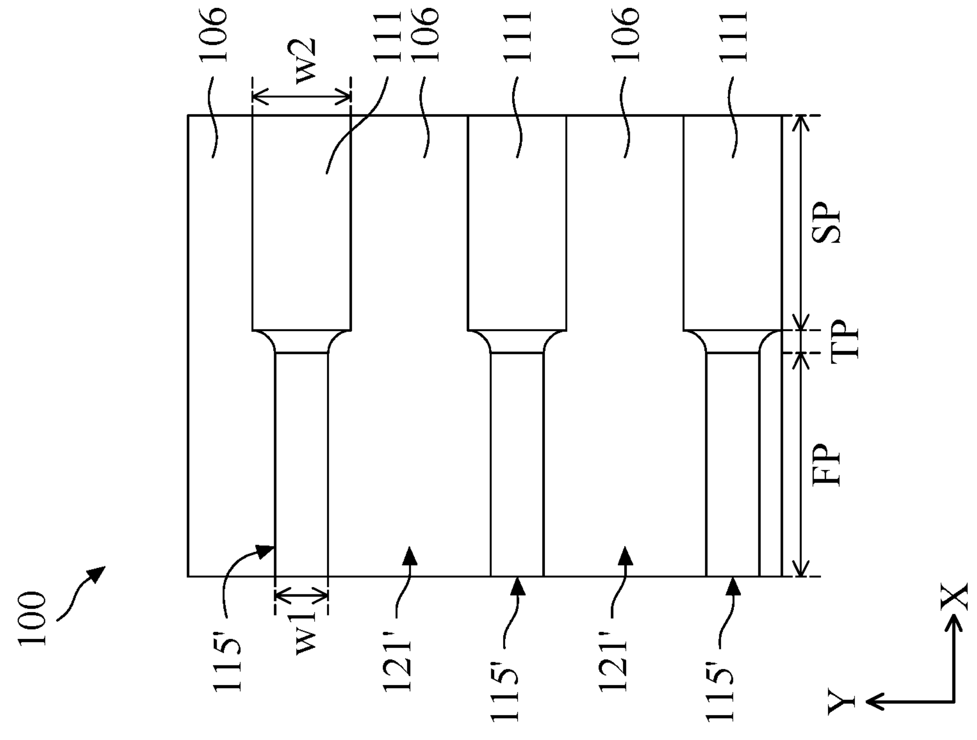

FIGS. 5A-5C are perspective, top, and side views, respectively, of another stage of manufacturing the semiconductor device structure 100, in accordance with some embodiments. In FIGS. 5A-5C, the second pattern of the second photoresist layer 123 is transferred to the hard mask fin structures 115 to form modified hard mask fin structures 115'. The modified hard mask fin structures 115' may be formed using multi-patterning operations including photolithography (FIGS. 4A-4B) and etching processes. The etching process may include dry etching, wet etching, reactive ion etching, and/or other suitable processes, or combinations thereof. In some embodiments, the etching process is a selective etching process that reduces the dimensions of the exposed first portion of the hard mask fin structures 115, while the second photoresist layer 123 and the first semiconductor layer 106 are not substantially affected. For example, the height in the Z direction and the width in the Y direction of the portions of the hard mask structures 115 not covered by the second photoresist layer 123 are reduced by the etching process. The second photoresist layer 123 is removed after the formation of the modified hard mask fin structures 115'. The etching process forms modified hard mask trenches 121' to define the modified hard mask fin structures 115'. As denoted FIG. 5B, the modified hard mask fin structures 115' include a first portion FP that defines a first width w1 and a second portion SP that defines a second width w2 that is greater than the first width w1, with a transition portion TP between the first portion FP and the second portion SP. In some embodiments, the modified hard mask fin structure 115 has a varying width along a longitudinal direction (X direction), as shown in FIG. 5B. In some embodiments, the second width w2 is not changed by the etching of the first portion of the hard mask fin structures 115. In some embodiments, the difference between the first width w1 and the second width w2 (which also may be referred to herein as "jog size") may be within a range of about 1 nm to about 20 nm. The transition portion TP is configured to transition between the first width w1 and the second width w2, as described in more detail below. In some embodiments, the length of the transition portion TP (which also may be referred to herein as "jog rounding"), in the X-direction, may be less than 1 CPP, such as within a range of about 20 nm or less, such as about 0 nm to about 20 nm, such as about 0 nm to about 15 nm, such as about 0 nm to about 10 nm, such as about 0 nm to about 5 nm.

Figure 6A:
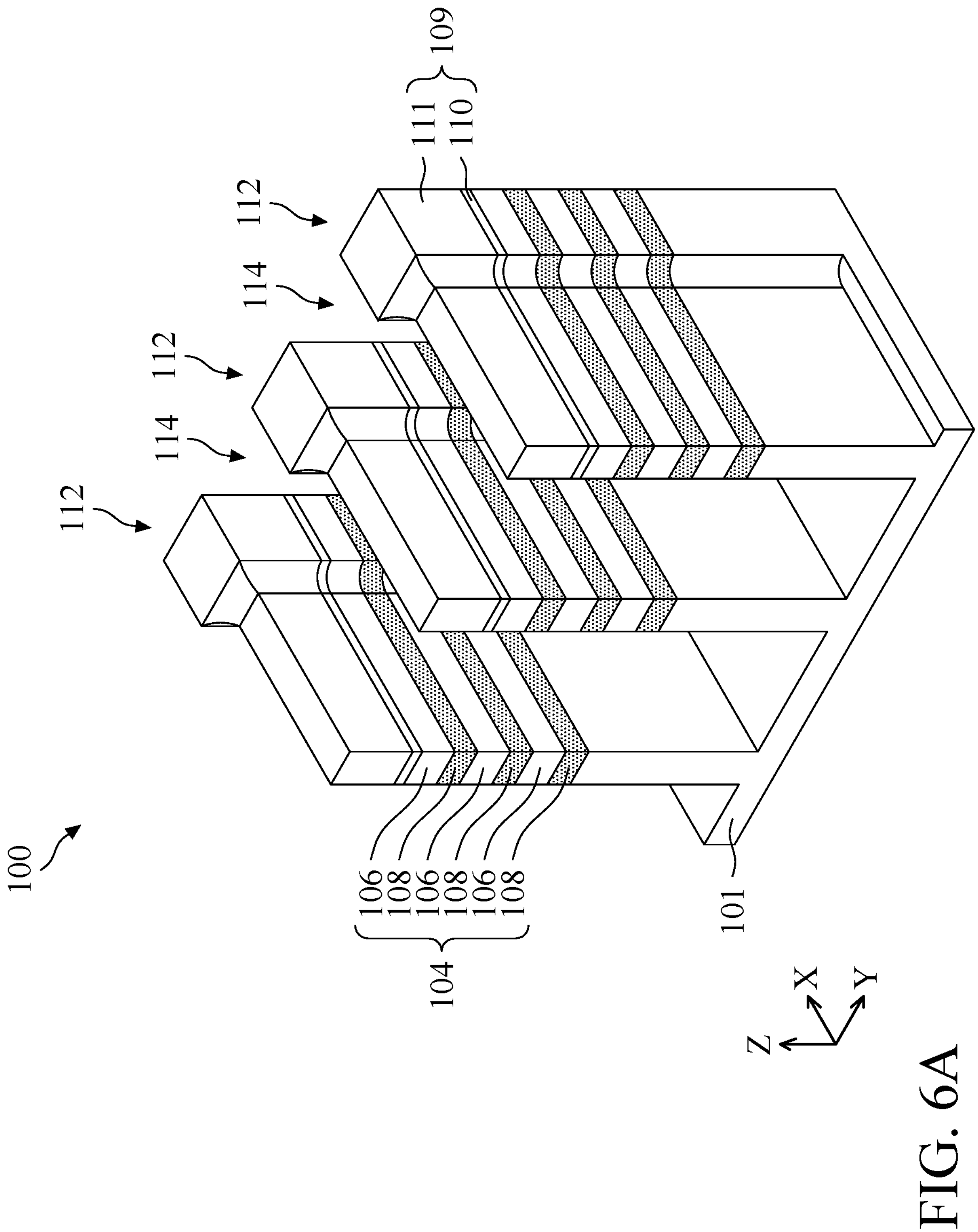
Figure 6C:
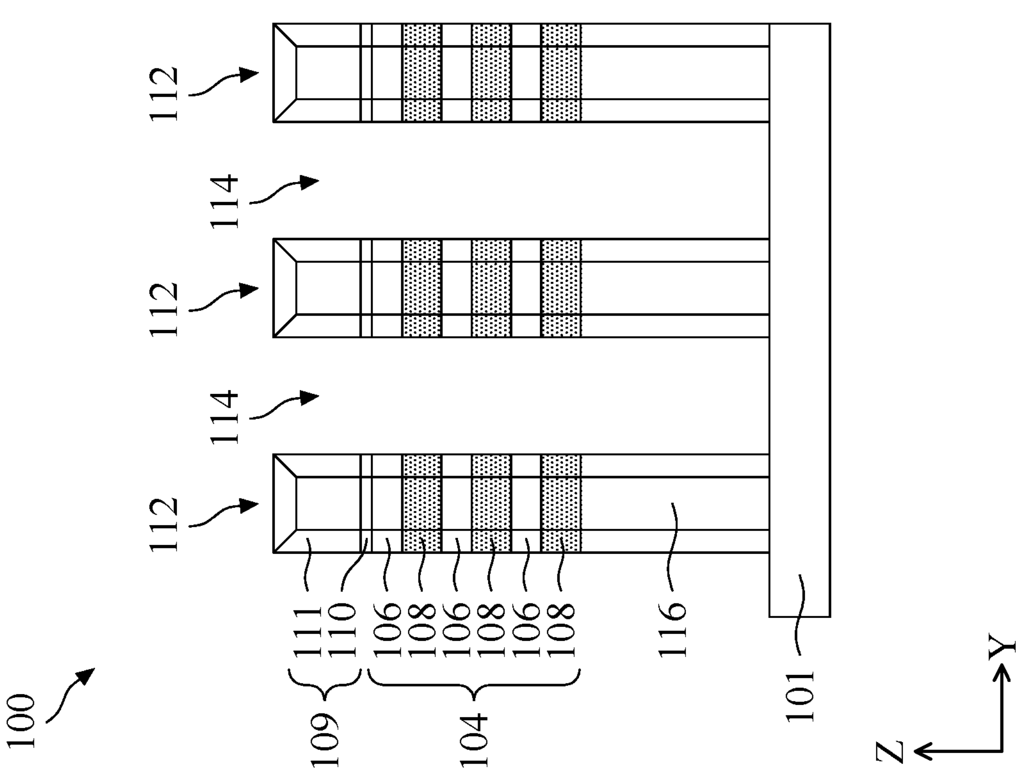
Figure 6B:
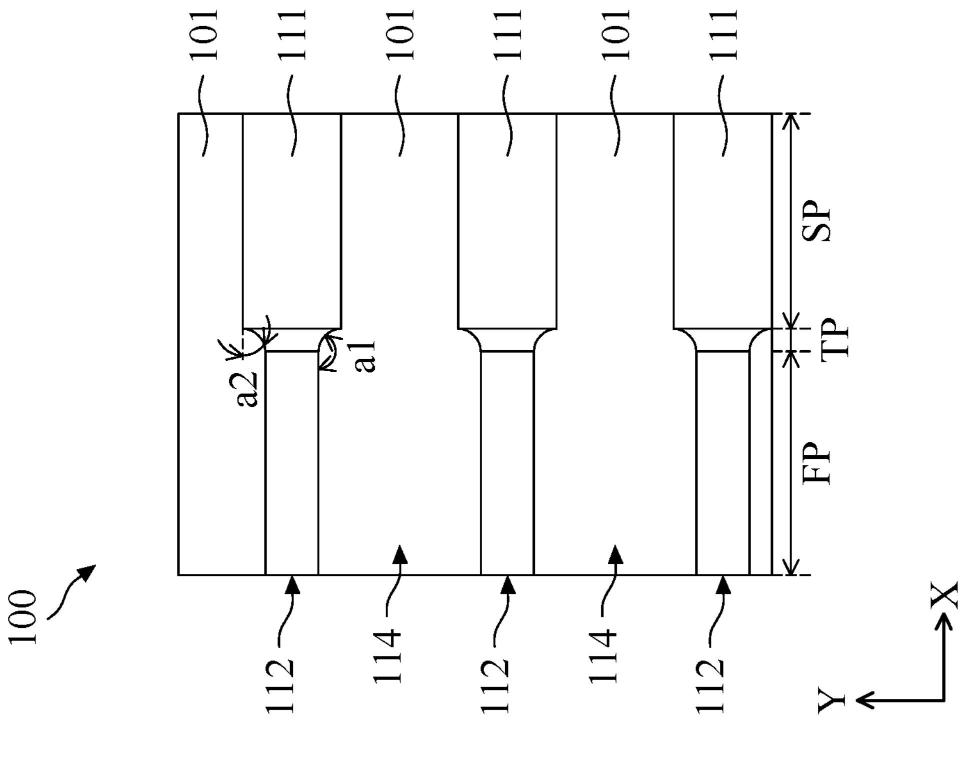

FIGS. 6A-6C are perspective, top, and side views, respectively, of another stage of manufacturing the semiconductor device structure 100, in accordance with some embodiments. In FIGS. 6A-6C, a plurality of fin structures 112 are formed from the stack of semiconductor layers 104 (e.g., corresponding to the pattern/profile (top view) of the modified hard mask fin structures 115'). Each fin structure 112 has an upper portion including the semiconductor layers 106, 108 and a well portion 116 formed from the substrate 101. The fin structures 112 may be formed by an etching process. The etching process may include dry etching, wet etching, reactive ion etching, and/or other suitable processes, or combinations thereof. The etching process forms trenches 114 in unprotected regions, through the stack of semiconductor layers 104 and into the substrate 101, to define the plurality of fin structures 112 separated by the trenches 114. As illustrated in FIGS. 6A-6B, the fin structures 112 and the trenches 114 extend lengthwise in the X-direction. In some embodiments, the fin structure 112 has a varying width along a longitudinal direction (X direction), as shown in FIG. 6A. As shown in FIG. 6B, the fin structures 112 have a shape that corresponds to respective modified hard mask fin structures 115'. For example, the first portion FP of the fin structure 112 may have the same first width w1 and the second portion SP of the fin structure 112 may have the same second width w2 compared to the modified hard mask fin structures 115'. In some other embodiments, the widths of the first portion FP, the second portion SP, and the transition portion TP of the fin structures 112 may be slightly greater than or slightly less than the corresponding widths of the respective modified hard mask fin structures 115' as a result, for example, of tolerances that are characteristic of etching processes. As shown in FIG. 6B, the transition portion TP of the fin structures 112 may intersect with the first portion FP at an angle a1 ranging from about 90 degrees to about 180 degrees, such as from about 140 degrees to about 170 degrees, for example from about 150 degrees to about 160 degrees. Likewise, the transition portion TP of the fin structures 112 may intersect with the second portion SP at an angle a2 ranging from about 0 degrees to about 90 degrees, such as about 20 degrees to about 70 degrees, for example from about 30 degrees to about 60 degrees. In some embodiments, the angle a1 is an obtuse angle, and the angle a2 is an acute angle.

Figure 7B:
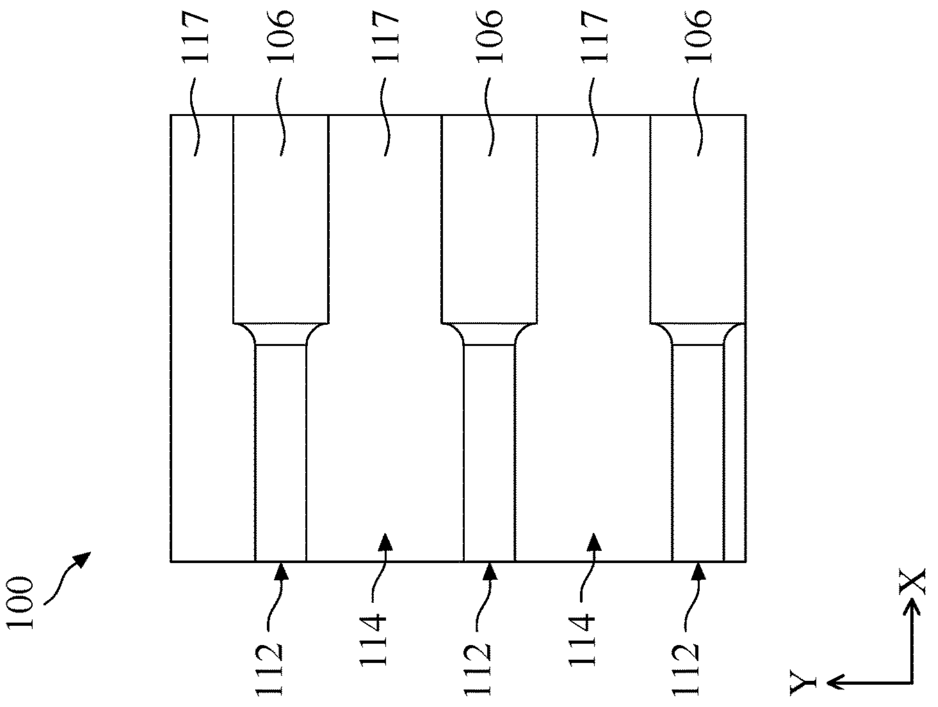
Figure 7A:
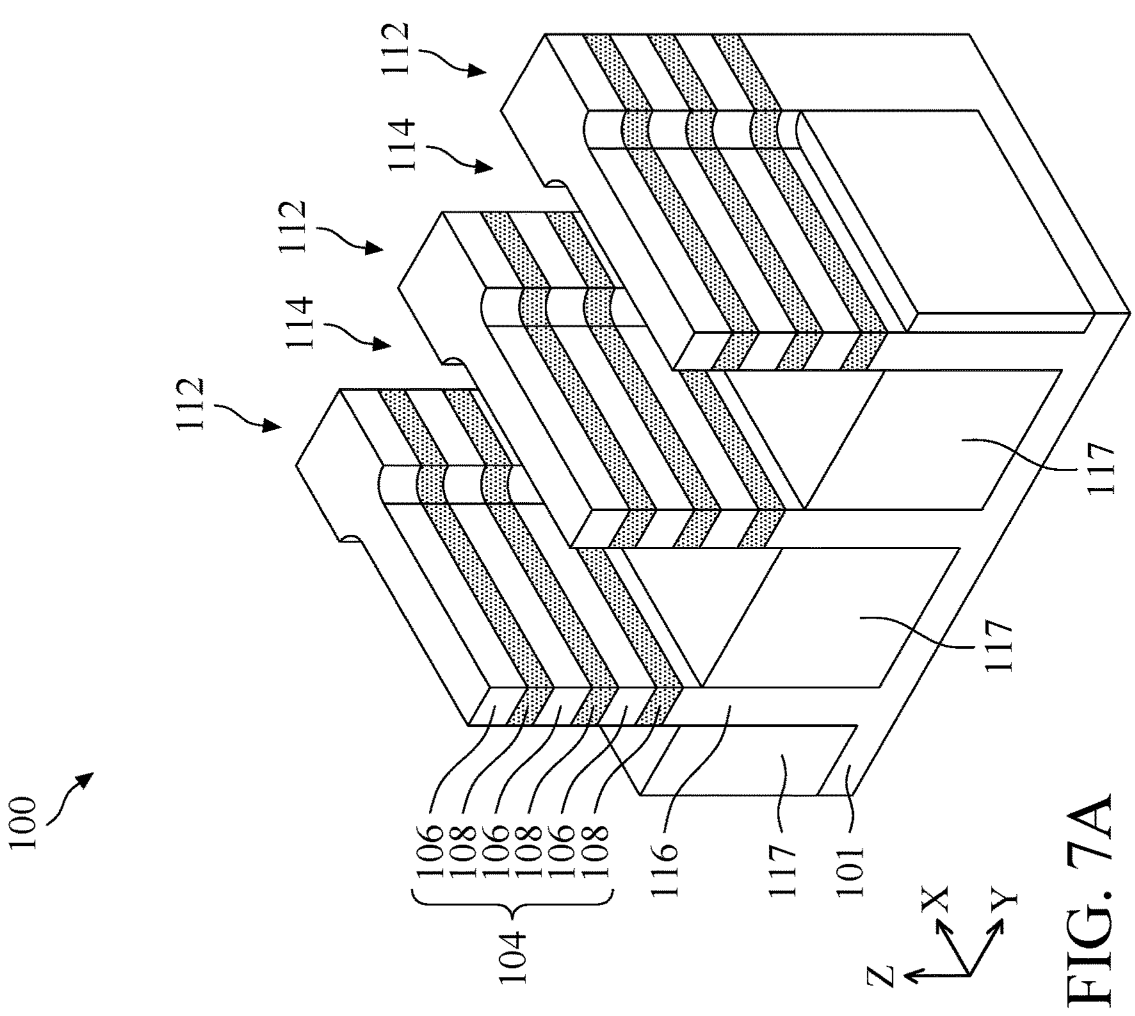

FIGS. 7A-7B are perspective and top views, respectively, of another stage of manufacturing the semiconductor device structure 100, in accordance with some embodiments. In FIGS. 7A-7B, an insulating layer 117 is deposited in the trenches 114 between neighboring fin structures 112. For example, the insulating layer 117 may be a shallow trench isolation (STI). The insulating layer 117 may be deposited over the substrate 101. The insulating layer 117 may be deposited from bottom-up, as shown in FIG. 7A. In some embodiments, the insulating layer 117 is deposited by a flowable chemical vapor deposition (FCVD) process. The insulating layer 117 may include a dielectric material, such as silicon oxide, silicon nitride, silicon oxynitride (SiON), SiOCN, SiCN, fluorine-doped silicate glass (FSG), a low-K dielectric material, a plasma enhanced oxide (PEOX), and/or any suitable dielectric material.

Figure 8A:
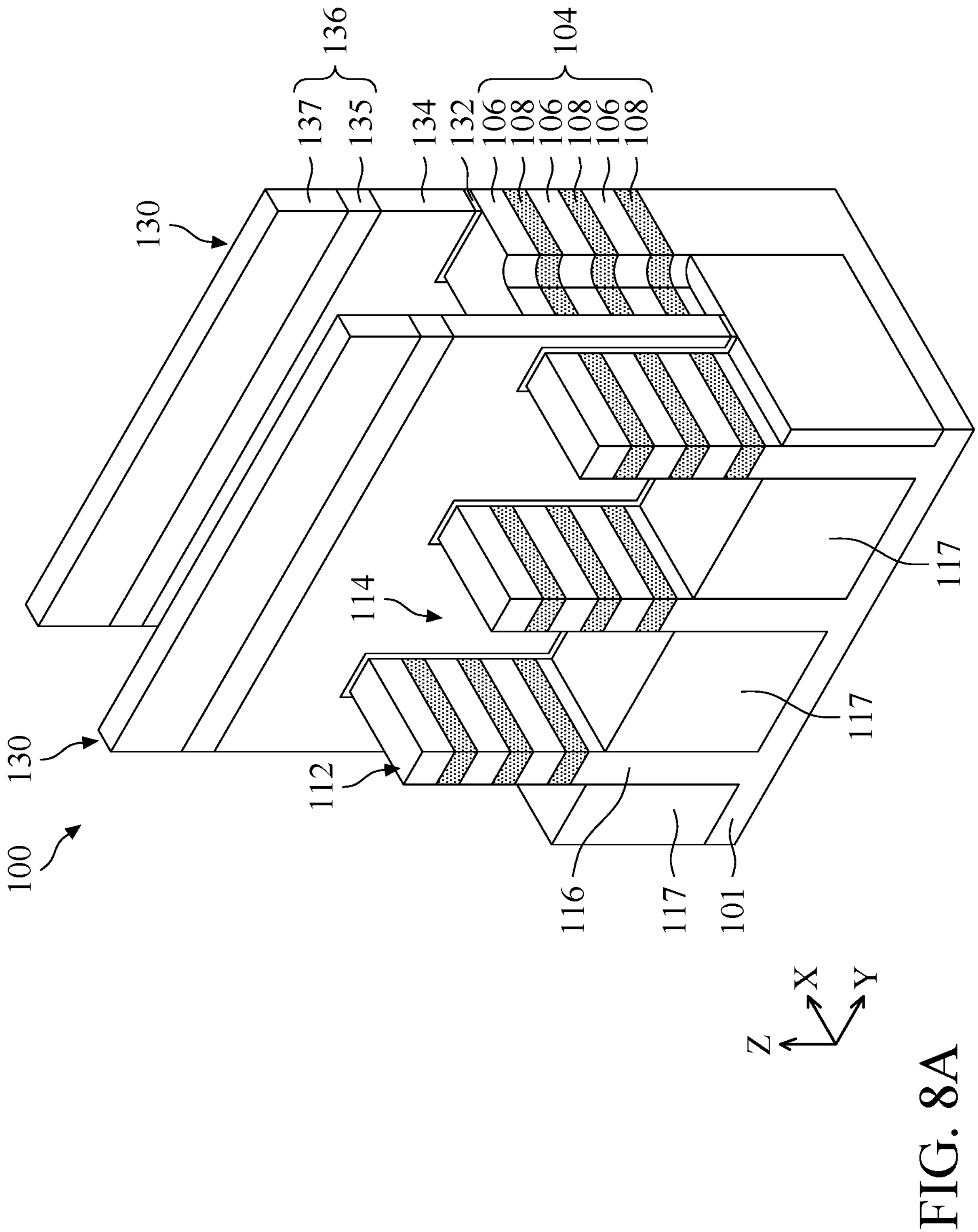
Figure 8B:
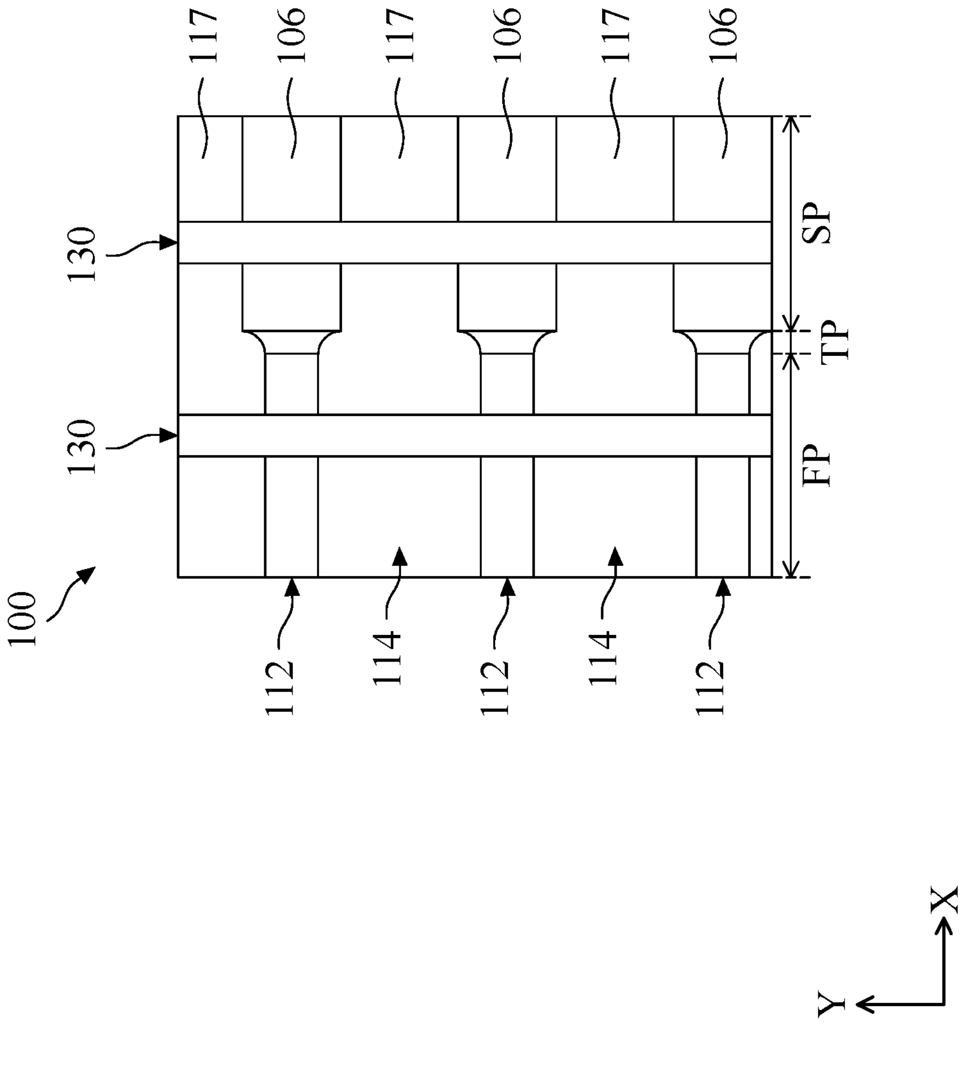

FIGS. 8A-8B are perspective and top views, respectively, of another stage of manufacturing the semiconductor device structure 100, in accordance with some embodiments. In FIGS. 8A-8B, one or more sacrificial gate structures 130 are formed over the semiconductor device structure 100. The sacrificial gate structures 130 are formed over first portions of the fin structures 112 and the insulating layer 117, while adjoining second portions are exposed.

As depicted in FIG. 8A, each sacrificial gate structure 130 may include a sacrificial gate dielectric layer 132, a sacrificial gate electrode layer 134, and a mask layer 136. In some embodiments, the mask layer 136 is a multi-layer structure. For example, the mask layer 136 may include an oxide layer 135 and a nitride layer 137 formed on the oxide layer 135. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, and then patterning those layers into the sacrificial gate structures 130. The sacrificial gate dielectric layer 132 may include one or more layers of dielectric material, such as a silicon oxide-based material. The sacrificial gate electrode layer 134 may include silicon, such as polycrystalline silicon or amorphous silicon. The first portions of the fin structures 112 that are covered by the sacrificial gate electrode layer 134 of the sacrificial gate structure 130 serve as channel regions for the semiconductor device structure 100.

As depicted in FIG. 8B, the sacrificial gate structures 130 extend lengthwise in the Y-direction (perpendicular to the fin structures 112). For example, first (e.g., left) and second (e.g., right) sacrificial gate structures 130 may straddle the transition portion TP of the fin structures 112 (e.g., being disposed over the first portion FP and second portion SP, of the fin structures 112, respectively). In other words, boundaries of the transition portion TP of the fin structures 112 may be located in a space between the first and second sacrificial gate structures 130 without overlapping with any portion of the sacrificial gate structures 130. In some embodiments, fin structures are formed by the "jog first approach" as described above, and the length of the transition portion TP in the X direction is substantially longer than the length of the transition portion TP shown in FIG. 8B. For example, the "jog first approach" may form fin structures having the transition portion TP extending from one sacrificial gate structure 130 to the neighboring sacrificial gate structure 130. As a result, the dielectric spacers 144 (FIG. 13) to be formed may be susceptible to peeling due to the slant portion of the transition portion TP. Thus, with the "jog last approach" described herein, the length of the transition portion TP in the X direction may be substantially small, such as smaller than the CPP, and the chance of peeling of the dielectric spacers 144 is substantially reduced.

Figure 9:
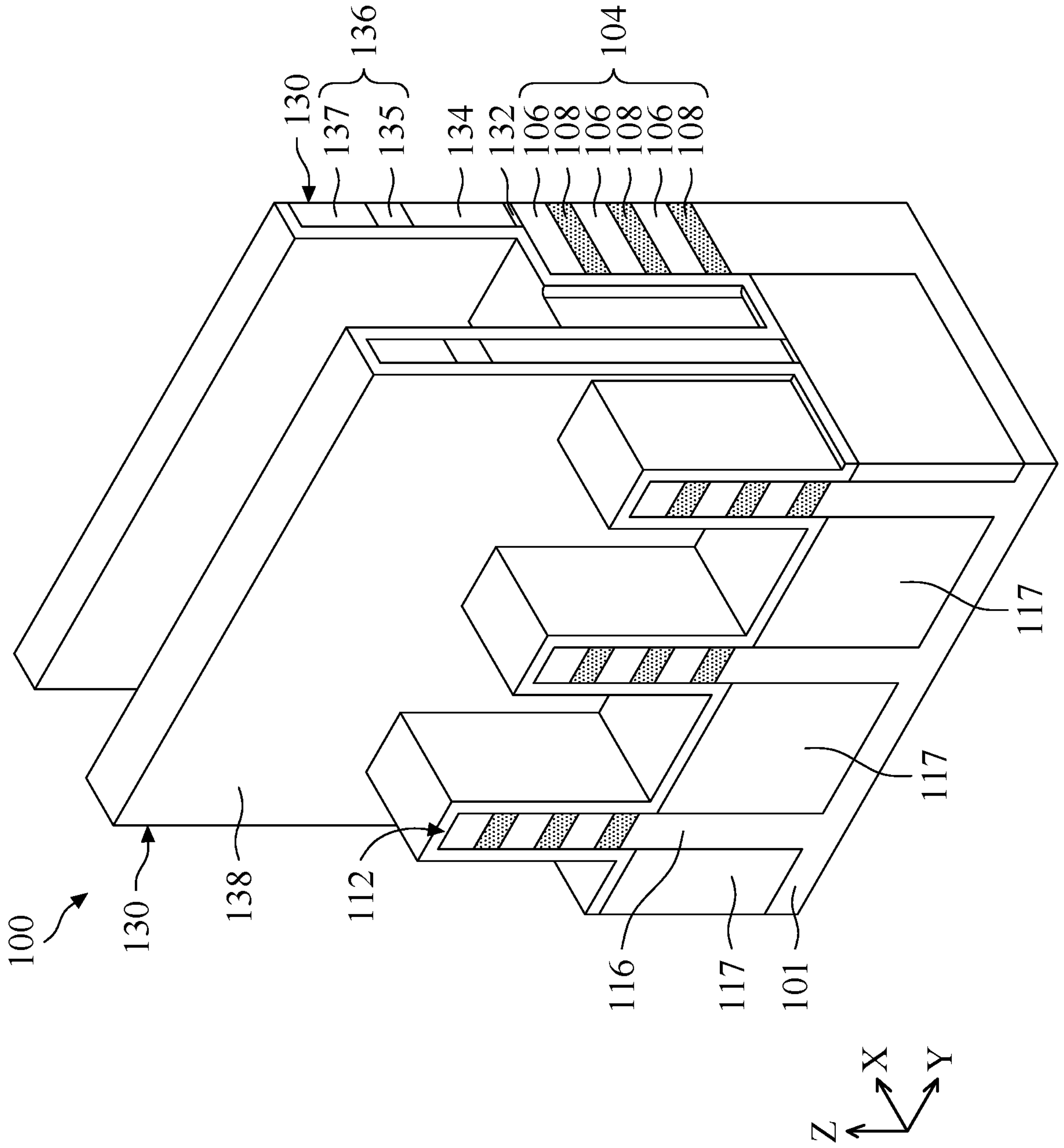

FIG. 9 is a perspective view of another stage of manufacturing the semiconductor device structure 100, in accordance with some embodiments. In FIG. 9, a spacer layer 138 is formed over (e.g., covering) the sacrificial gate structures 130, the second portions of the fin structures 112, and the second portions of the insulating layer 117. The spacer layer 138 may include one or more layers of dielectric material, such as silicon oxide, silicon nitride, silicon carbide, silicon oxynitride, SiCN, silicon oxycarbide, SiOCN, and/or combinations thereof. In some embodiments, the spacer layer 138 includes two dielectric layers. In some embodiments, the spacer layer 138 is formed by a conformal process, such as an atomic layer deposition (ALD) process. In some embodiments, the spacer layer 138 has a thickness ranging from about 2 nm to about 10 nm.

Figure 10:
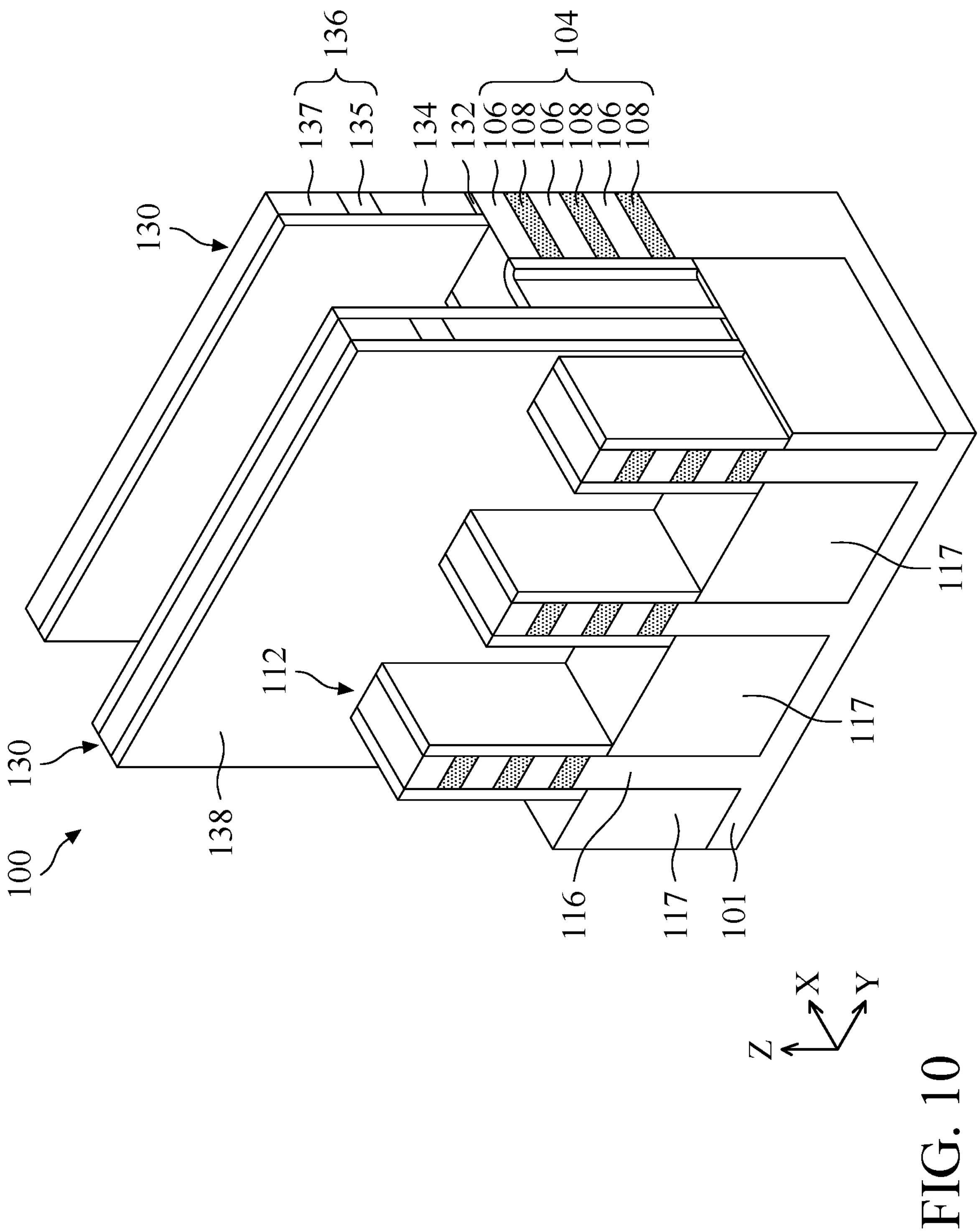

FIG. 10 is a perspective view of another stage of manufacturing the semiconductor device structure 100, in accordance with some embodiments. In FIG. 10, an anisotropic etch process is performed to remove horizontal portions of the spacer layer 138. The anisotropic etch process may be a selective etch process that does not substantially affect the nitride layer 137, the first semiconductor layer 106, and the insulating layer 117. As a result, the second portions of the fin structures 112, apart from regions covered by vertical portions of the spacer layer 138, are exposed.

Figure 11:
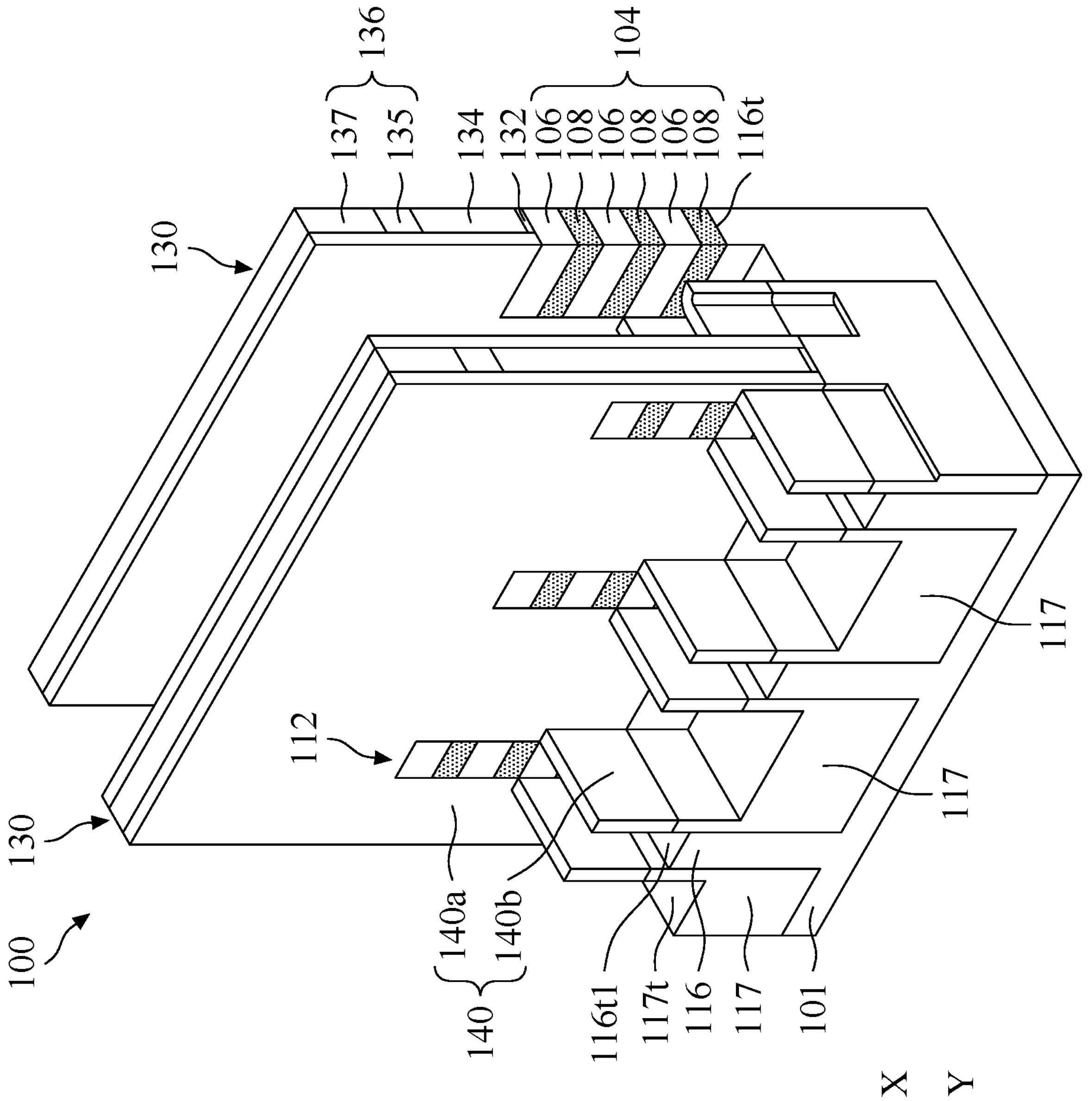

FIG. 11 is a perspective view of another stage of manufacturing the semiconductor device structure 100, in accordance with some embodiments. In FIG. 11, one or more etch processes are performed to recess the exposed second portions of the fin structures 112 that are not covered by the sacrificial gate structures 130 (and the portions of the spacer layer 138 formed on sidewalls of the sacrificial gate structures 130) and to remove portions of the spacer layer 138. In some embodiments, portions of the spacer layer 138 formed on sidewalls of the mask layer 136 also may be recessed. The one or more etch processes may include a dry etch, such as reactive ion etching, neutral beam etching (NBE), or the like, and/or a wet etch, such as using tetramethylammonium hydroxide (TMAH), or ammonium hydroxide ($NH_4OH$). The one or more etch processes form spacers 140 including a first portion 140*a* formed on sidewalls of the sacrificial gate electrode layer 134 and second portions 140*b* formed on the second portions of the insulating layer 117. In some embodiments, the one or more etch processes also remove portions of the second portions of the insulating layer 117, as shown in FIG. 11. As a result, a top surface 117*t* of the second portion of the insulating layer 117 may be defined, after the one or more etch processes, at a level (e.g., in the Z-direction) that is substantially below a top surface 116*t*1, outside the channel region, of the well portion 116. In some embodiments, the top surface 116*t*1 may be defined at a level that is below (e.g., in the Z-direction) a top surface 116*t* of the well portion 116 that is located underneath the sacrificial gate structure 130.

Figure 12:
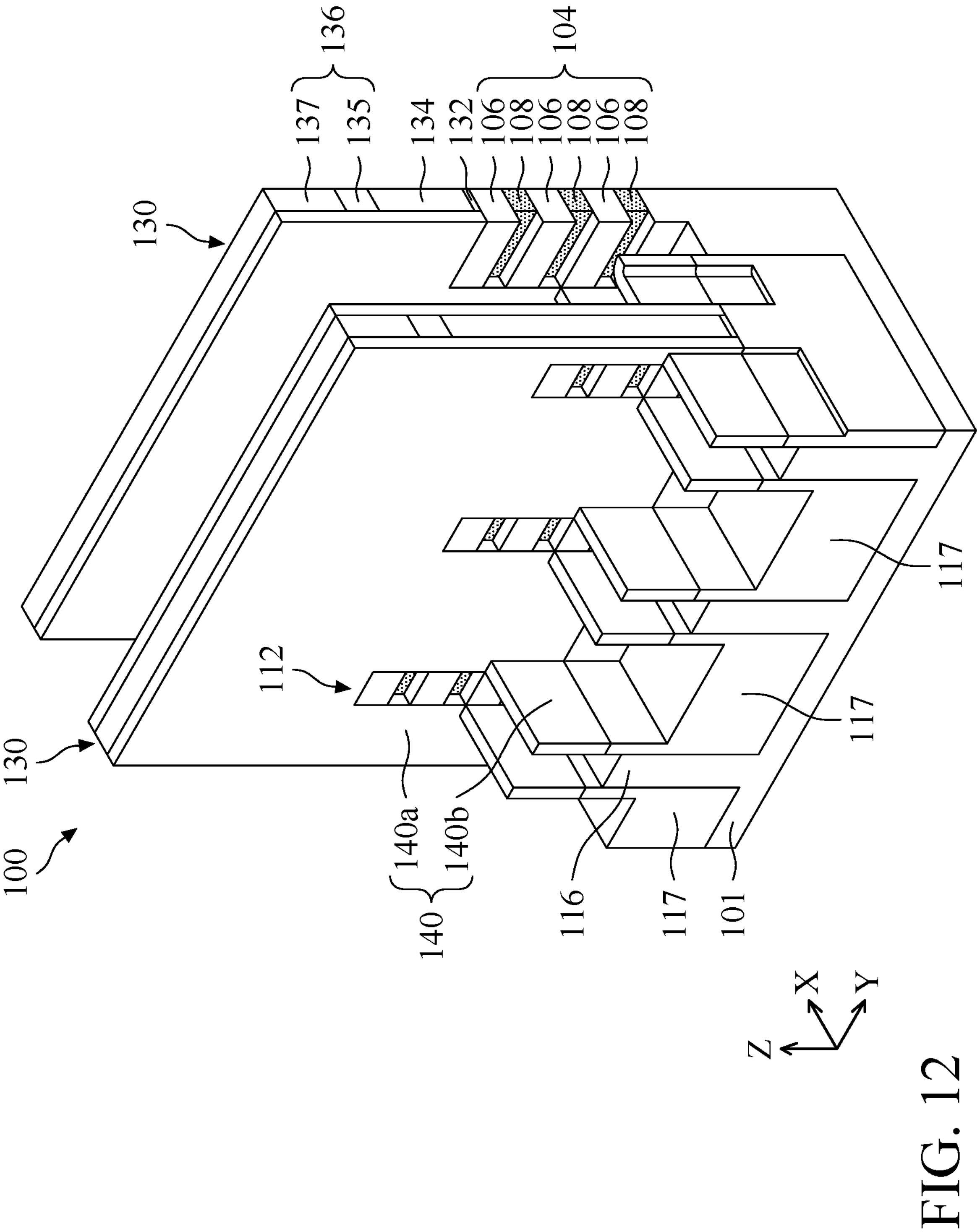

FIG. 12 is a perspective view of another stage of manufacturing the semiconductor device structure 100, in accordance with some embodiments. In FIG. 12, edge portions of each second semiconductor layer 108 of the stack of semiconductor layers 104 are removed horizontally along the X-direction. The removal of the edge portions of the second semiconductor layers 108 forms cavities between adjoining first semiconductor layers 106 that are above and below the second semiconductor layers 108. In some embodiments, the portions of the second semiconductor layers 108 are removed by a selective wet etch process. In embodiments where the second semiconductor layers 108 are made of SiGe and the first semiconductor layers 106 are made of silicon, the second semiconductor layers 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

Figure 13:
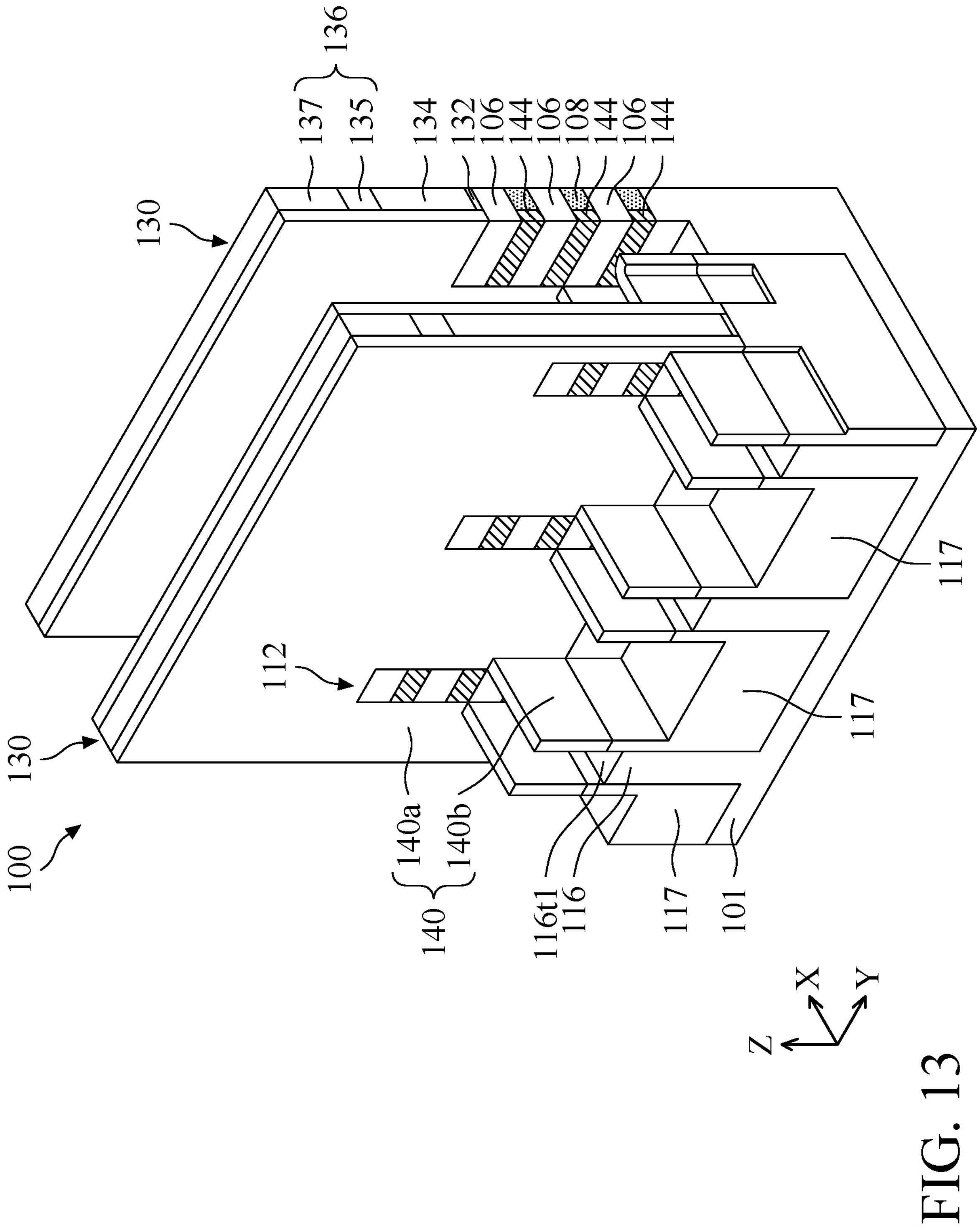

FIG. 13 is a perspective view of another stage of manufacturing the semiconductor device structure 100, in accordance with some embodiments. In FIG. 13, after removing edge portions of each second semiconductor layer 108 (FIG. 12), a dielectric layer is deposited in the cavities to form dielectric spacers 144. The dielectric spacers 144 may be made of a low-K dielectric material, such as SION, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected, from etching, by the first semiconductor layers 106 during the anisotropic etching process. The remaining second semiconductor layers 108 are capped between the dielectric spacers 144 along the X-direction. The dielectric spacer 144 has a length along the Y-direction and a width along the X-direction. In some embodiments, the length of the dielectric spacer 144 located in the first portion FP of the fin structure 112 (FIG. 8B) is substantially smaller than the length of the dielectric spacer 144 located in the second portion SP of the fin structure 112 (FIG. 8B), because the width of the first portion FP of the fin structure 112 is substantially smaller than the width of the second portion SP of the fin structure 112. In some embodiments, a same amount of edge portions of each second semiconductor layer 108 was removed by the process described in FIG. 12, regardless of the location of the second semiconductor layer 108 (i.e., in the first portion FP of the fin structure 112 or the second portion SP of the fin structure 112). As a result, the width of the dielectric spacer 144 located in the first portion FP of the fin structure 112 is substantially the same as the width of the dielectric spacer 144 located in the second portion SP of the fin structure 112. Thus, in some embodiments, the dielectric spacers 144 have a different width to length ratio depending on the location of the dielectric spacer 144. The dielectric spacers 144 located in the first portion FP of the fin structure 112 has a first width to length ratio, and the dielectric spacers 144 located in the second portion SP of the fin structure 112 has a second width to length ratio substantially smaller than the first width to length ratio.

Figure 14A:
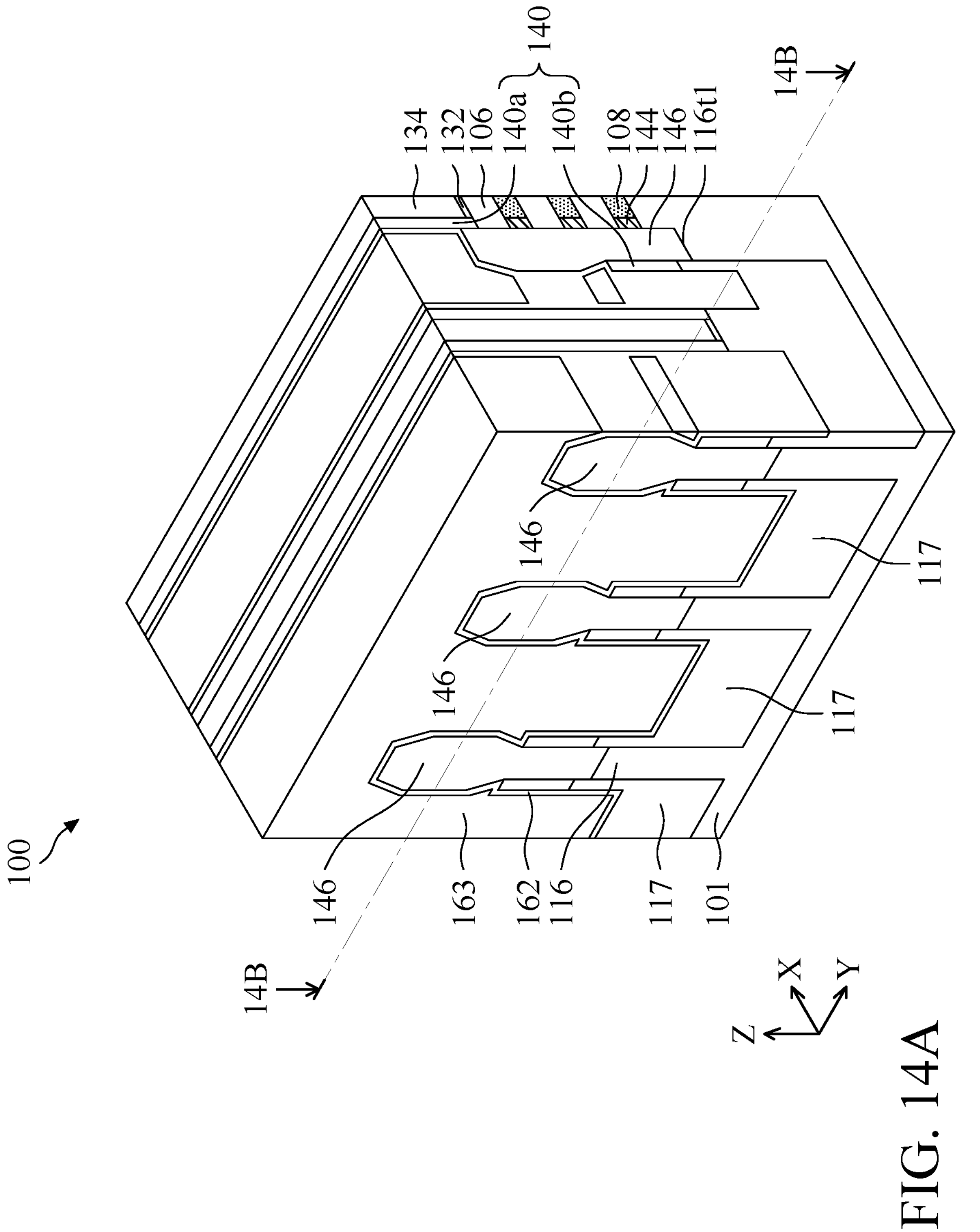
Figure 14B:
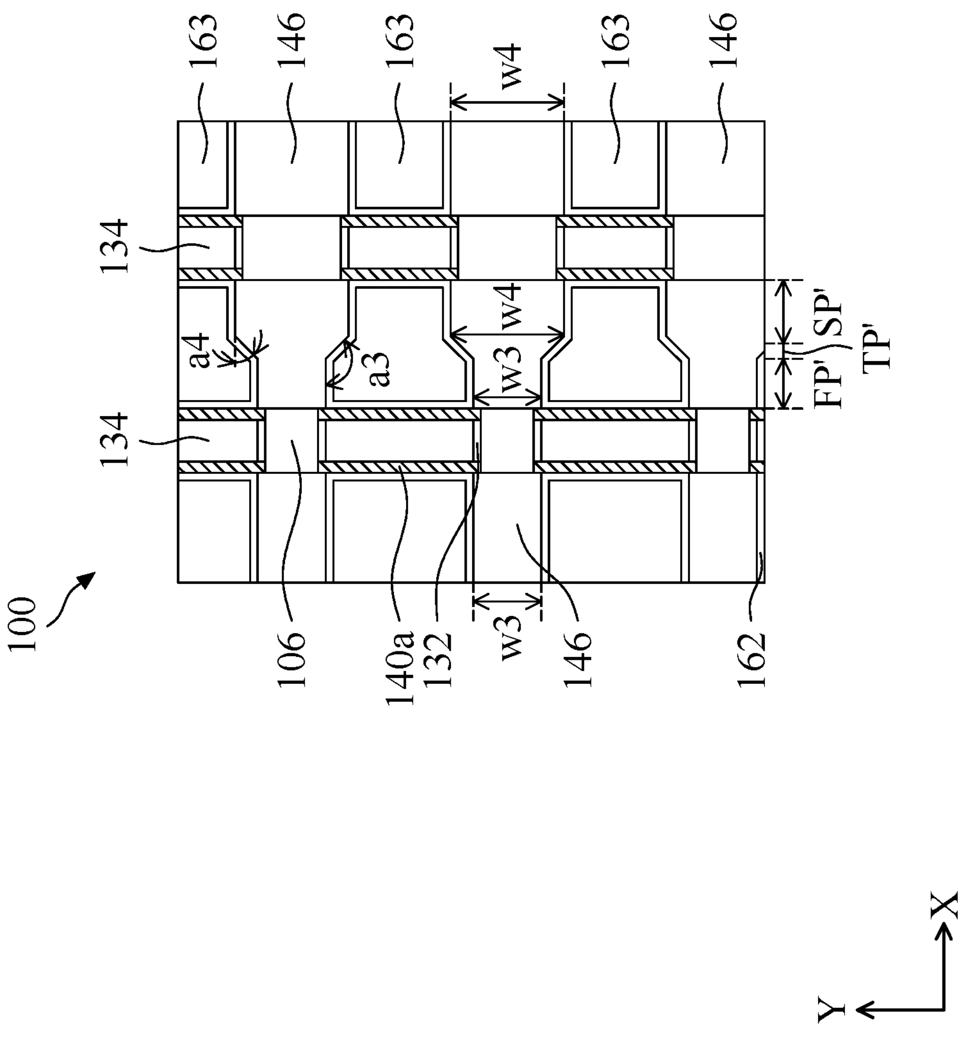

FIGS. 14A-14B are perspective and top cross-sectional views, respectively, of another stage of manufacturing the semiconductor device structure 100, in accordance with some embodiments. In FIGS. 14A-14B, source/drain (S/D) regions 146 are formed from the well portion 116 (e.g., formed on respective top surfaces 116*t*1 of the well portion 116). The S/D regions 146 may grow both vertically and horizontally to form facets, which may correspond to crystalline planes of the material of the well portion 116. In this disclosure, a source region and a drain region are interchangeably used, and the structures thereof are substantially the same. Furthermore, source/drain region(s) may refer to a source or a drain, individually or collectively, dependent upon the context. The S/D regions 146 may be made of one or more layers of Si, SiP, SiC and SiCP for n-type FETs (NFETs) or Si, SiGe, and Ge for p-type FETs (PFETs). For PFETs, p-type dopants, such as boron (B), may also be included in the S/D regions 146. The S/D regions 146 may be formed by an epitaxial growth method using CVD, ALD or MBE.

As shown in FIGS. 14A-14B, a contact etch stop layer (CESL) 162 is conformally formed on the exposed surfaces of the semiconductor device structure 100. The CESL 162 covers the sidewalls of the first portion 140*a* of the spacers 140 and is disposed on the second portion 140*b* of the spacers 140 and the S/D regions 146. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, an interlayer dielectric (ILD) layer 163 is formed on the CESL 162. The materials for the ILD layer 163 may include compounds including Si, O, C, and/or H, such as silicon oxide, SiCOH, or SiOC. Organic materials, such as polymers, may also be used for the ILD layer 163. The ILD layer 163 may be deposited by a PECVD process or other suitable deposition technique. In some embodiments, after formation of the ILD layer 163, the semiconductor device structure 100 may be subject to a thermal process to anneal the ILD layer 163.

As shown in FIG. 14A, a planarization process is performed to expose the sacrificial gate electrode layer 134. The planarization process may be any suitable process, such as a CMP process. The planarization process removes portions of the ILD layer 163 and the CESL 162 disposed on the sacrificial gate stacks 130. The planarization process may also remove the mask structure 136.

As shown in FIG. 14B, the S/D regions 146 include a shape that corresponds to respective well portions 116 of the fin structures 112 that are underlying the respective S/D regions 146. For example, the S/D regions 146 located between the two sacrificial gate electrode layers 134 each includes a first portion FP' having a third width w3 and second portion SP' having a fourth width w4 that is greater than the third width w3, with a transition portion TP' between FP' and SP'. The transition portion TP' is configured to transition between the third width w3 and the fourth width w4. Because of the epitaxial growth pattern that is characteristic of the S/D regions 146, the transition portion TP' has a more gently sloping (e.g., substantially linear) taper, or transition, compared to the transition portion TP of the fin structures 112. For example, the transition portion TP' may intersect the first portion FP' at an angle a3 that is less than the angle a1, and for example, the transition portion TP' may intersect the second portion SP' at an angle a4 that is less than the angle a2. In some embodiments, a ratio of a3/a1, as well as a ratio of a4/a2, may be within a range of about 0.5 to about 1, such as about 0.7 to about 0.9.

As shown in FIG. 14B, as a result of the fin structure 112 having a varying width along a longitudinal direction (X direction), the S/D regions 146 have different shapes depending on the location thereof. For example, the S/D regions 146 formed in the regions corresponding to the first portion FP of the fin structures 112 each has the constant third width w3 along the X direction, the S/D regions 146 formed in the regions corresponding to the second portion SP of the fin structures 112 each has the constant fourth width w4 along the X direction, and the constant fourth width w4 is substantially greater than the constant third width w3. The S/D regions 146 formed in the regions corresponding to the transition portion TP of the fin structure each has a varying width along the X direction, and the varying width includes the widths w3, w4, and the widths transitioning from the width w3 to the width w4.

In some embodiments, a first plurality of dielectric spacers 144 (FIG. 14B) are located in the first portion FP of the fin structure 112, and a second plurality of dielectric spacers 144 are located in the second portion SP of the fin structure 112. Each of the first plurality of dielectric spacers 144 has a first width to length ratio, and each of the second plurality of dielectric spacers 144 has a second width to length ratio substantially smaller than the first width to length ratio. In some embodiments, the S/D region 146 located between the between the sacrificial gate electrode layer 134 located over the first portion FP of the fin structure 112 and the sacrificial gate electrode layer 134 located over the second portion SP of the fin structure 112 is in contact with first and second pluralities of the dielectric spacers 144.

Figure 15:
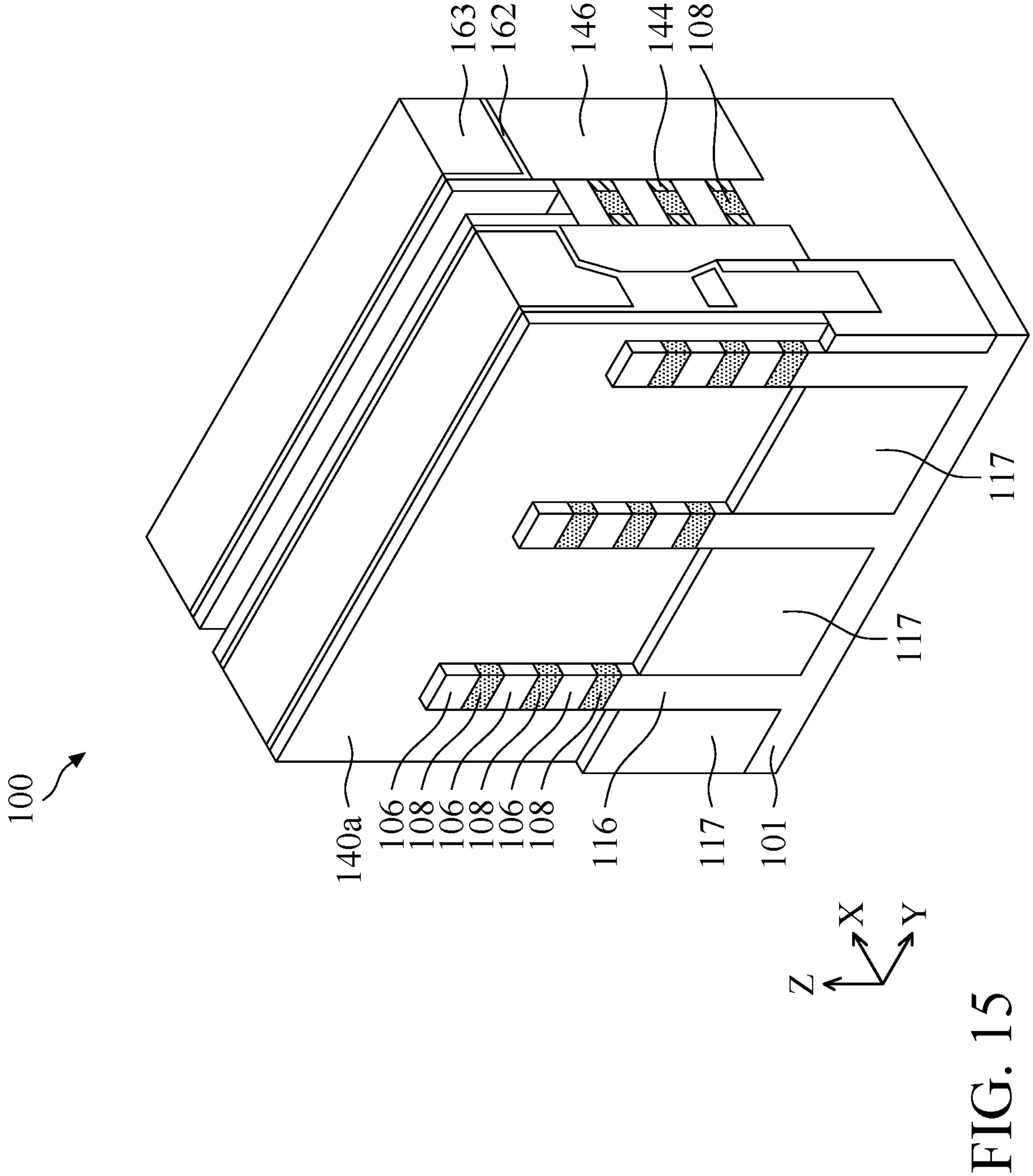

FIG. 15 is a perspective view of another stage of manufacturing the semiconductor device structure 100, in accordance with some embodiments. In FIG. 15, the sacrificial gate electrode layer 134 and the sacrificial gate dielectric layer 132 are removed, exposing a portion of the top surface of the topmost first semiconductor layer 106. The first portions of the insulating layer 117 are also exposed. The sacrificial gate electrode layer 134 may be first removed by any suitable process, such as dry etch, wet etch, or a combination thereof, followed by the removal of the sacrificial gate dielectric layer 132, which may be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the spacers 140, the insulating layer 117, the ILD layer 163, and the CESL 162.

After removing the sacrificial gate electrode layer 134 and the sacrificial gate dielectric layer 132, the second semiconductor layers 108 may be removed using a selective wet etching process. In embodiments where the second semiconductor layers 108 are made of SiGe and the first semiconductor layers 106 are made of Si, the chemistry used in the selective wet etching process removes the SiGe while not substantially affecting Si, the dielectric materials of the spacers 140, the insulating layer 117, and the dielectric spacers 144. In one embodiment, the second semiconductor layers 108 can be removed using a wet etchant such as, but not limited to, hydrofluoric acid (HF), nitric acid ($HNO_3$), hydrochloric acid (HCl), phosphoric acid ($H_3PO_4$), a dry etchant such as fluorine-based (e.g., $F_2$) or chlorine-based (e.g., $Cl_2$) gas, or any suitable isotropic etchants.

Figure 16A:
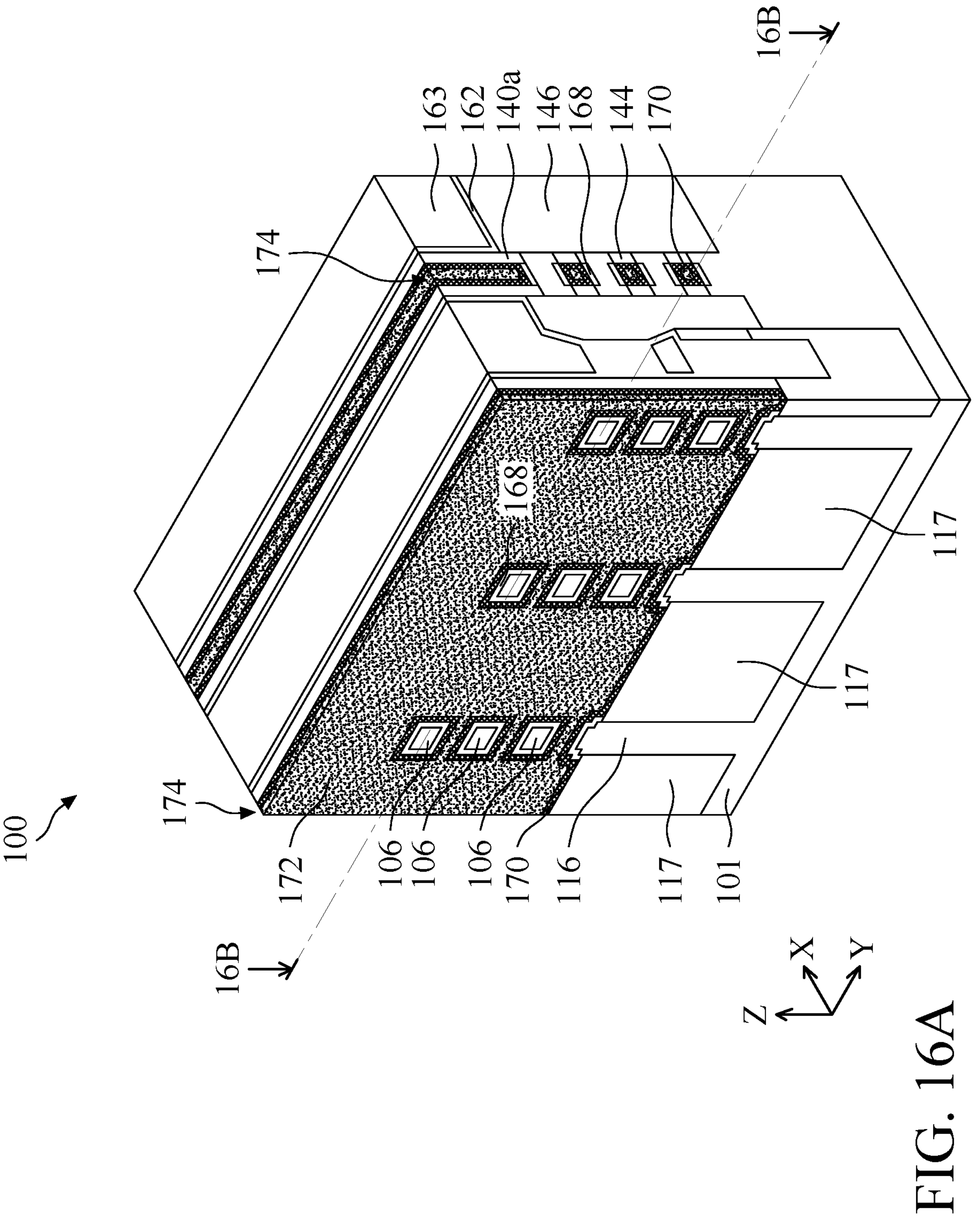
Figure 16B:
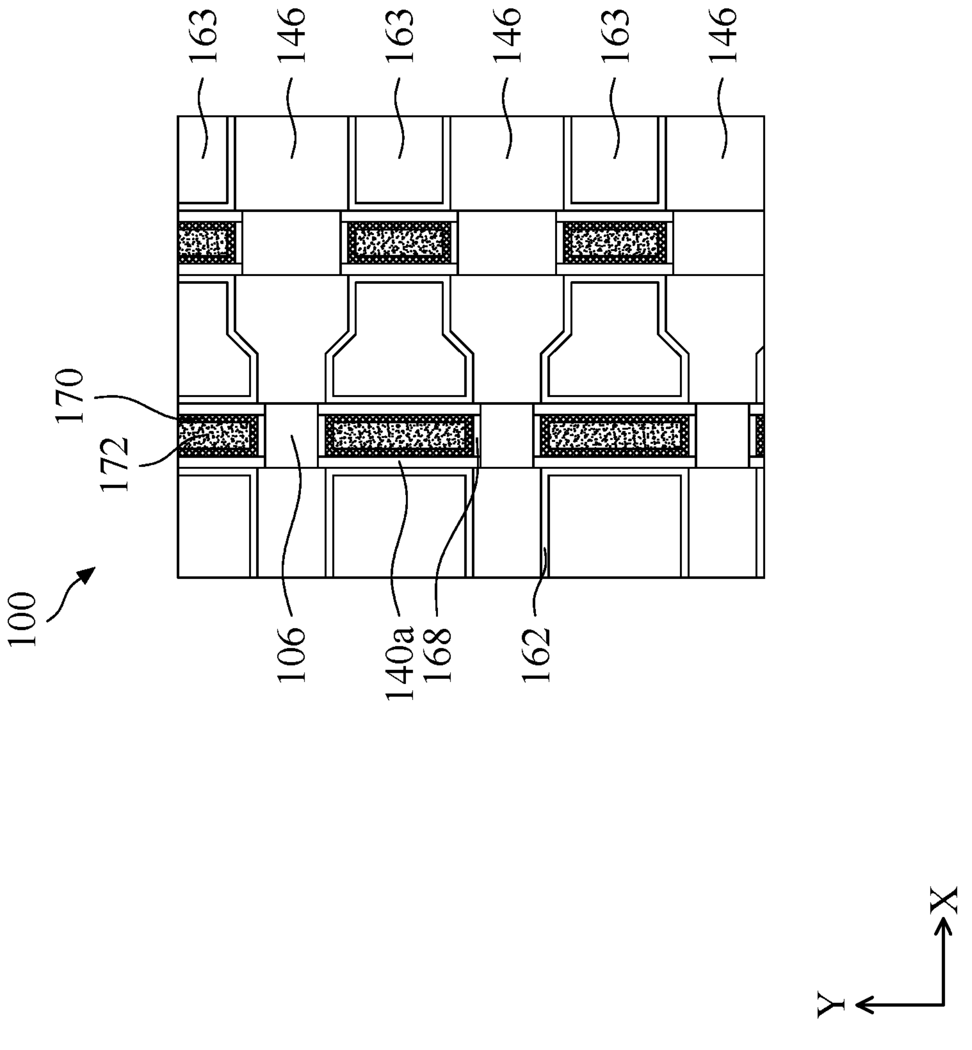

As shown in FIGS. 16A and 16B, after removing the second semiconductor layers 108 to form nanostructure channels (i.e., the exposed portions of the first semiconductor layers 106), a gate dielectric layer 170 is formed to surround the exposed portions of the first semiconductor layers 106, and a gate electrode layer 172 is formed on the gate dielectric layer 170. The gate dielectric layer 170 and the gate electrode layer 172 may be collectively referred to as a gate structure 174. In some embodiments, the transition portion TP does not overlap with any portion of the gate structure 174. In some embodiments, an interfacial layer (IL) 168 is formed between the gate dielectric layer 170 and the exposed surfaces of the first semiconductor layers 106. The IL 168 may include an oxide, such as silicon oxide, and may be formed as a result of a clean process. In some embodiments, the gate dielectric layer 170 includes one or more layers of a dielectric material, such as silicon oxide, silicon nitride, or high-K dielectric material, other suitable dielectric material, and/or combinations thereof. Examples of high-K dielectric materials include $HfO_2$, HfSiO, HfSiON, HfTaO, HfTIO, HfZrO, zirconium oxide, aluminum oxide, titanium oxide, hafnium dioxide-alumina ($HfO_2$—$Al_2O_3$) alloy, other suitable high-K dielectric materials, and/or combinations thereof. The gate dielectric layer 170 may be formed by CVD, ALD or any suitable deposition technique. The gate electrode layer 172 may include one or more layers of conductive material, such as polysilicon, aluminum, copper, titanium, tantalum, tungsten, cobalt, molybdenum, tantalum nitride, nickel silicide, cobalt silicide, TiN, WN, TiAI, TiAIN, TaCN, TaC, TaSiN, metal alloys, other suitable materials, and/or any combinations thereof. The gate electrode layer 172 may be formed by CVD, ALD, electro-plating, or other suitable deposition techniques. The gate dielectric layer 170 and the gate electrode layer 172 also may be deposited over the ILD layer 163. The gate dielectric layer 170 and the gate electrode layer 172 formed over the ILD layer 163 are then removed by using, for example, CMP, until the top surface of the ILD layer 163 is exposed.

Figures 17A, 17B, 17C, 17D, 17E:
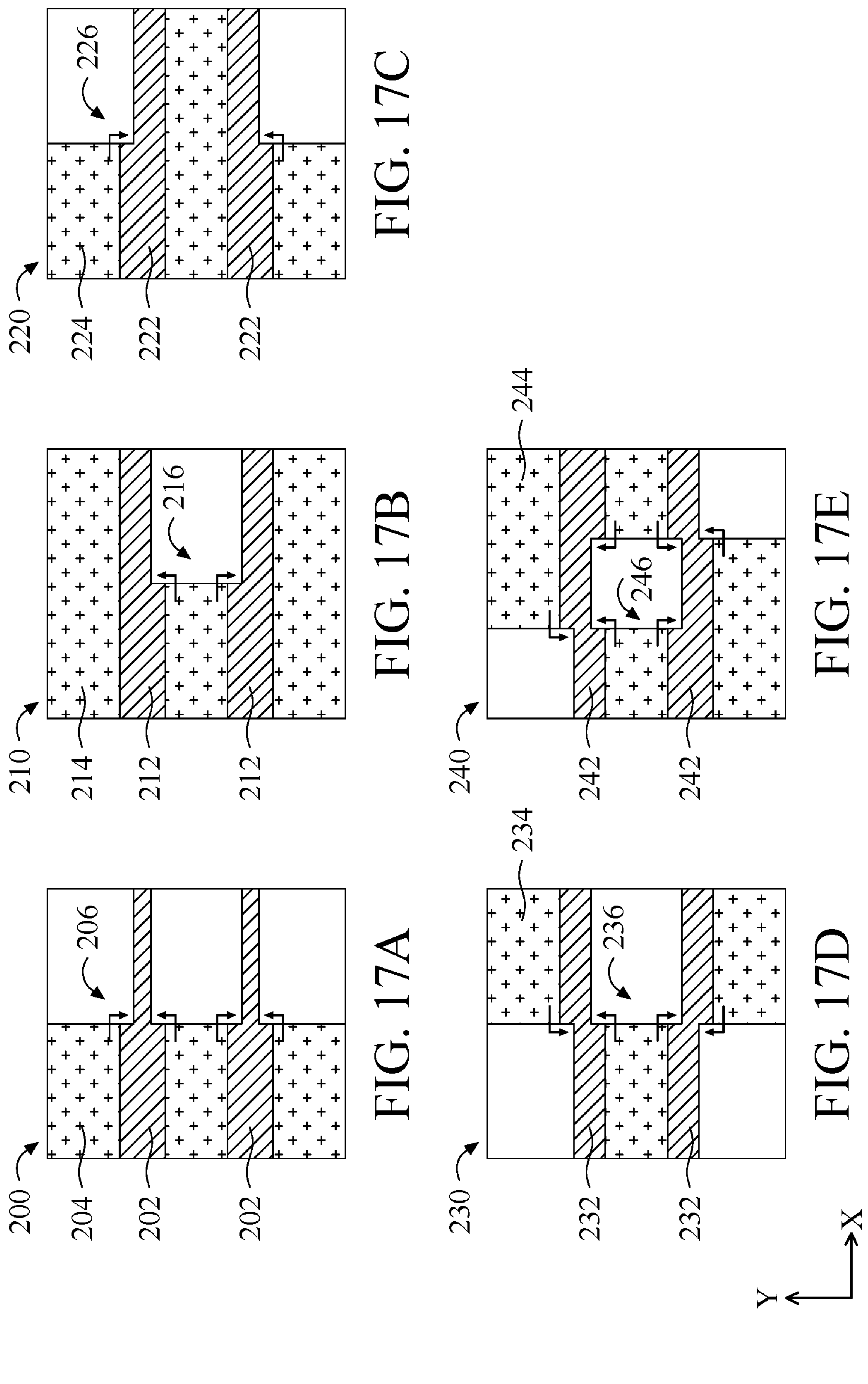
FIGS. 17A-17E are top views of various types of jog geometries, in accordance with some embodiments.

FIGS. 17A-17E are top views of various types of jog geometries, in accordance with some embodiments. Semiconductor device structures 200, 210, 220, 230, 240 are analogous to semiconductor device structure 100 (e.g., at the stage of manufacturing shown in FIGS. 5A-5C or, alternatively, FIGS. 6A-6C). In FIG. 17A, modified hard mask fin structures 202 include a symmetric jog 206 (e.g., similar to modified hard mask fin structure 115' of FIGS. 5A-5C). The symmetric jog 206, as illustrated by opposing arrows oriented in the same direction along the X-axis, includes narrowing of the width of the hard mask fin structures from both sides (e.g., at one or more overlapping points in the X-direction). An exemplary photoresist 204 that may be used to form the modified hard mask fin structures 202 is shown schematically in FIG. 17A to illustrate alignment between the modified hard mask fin structures 202 and the photoresist 204. For example, the photoresist 204 may protect portions of the hard mask fin structures that are not to be etched (e.g., similar to second photoresist layer 123 of FIGS. 4A-4B). Similar to the photoresist 204, other exemplary photoresists are illustrated in FIGS. 17B-17E, as described in more detail below.

In FIG. 17B, modified hard mask fin structures 212 include an inner jog 216. The inner jog 216, as illustrated by single arrows oriented from inside-out, includes narrowing of the width of the hard mask fin structures from the inner side only. An exemplary photoresist 214 is used to form the modified hard mask fin structures 212. For example, the photoresist 214 may protect portions of the hard mask fin structures that are not to be etched.

In FIG. 17C, modified hard mask fin structures 222 include an outer jog 226. The outer jog 226, as illustrated by single arrows oriented from outside-in, includes narrowing of the width of the hard mask fin structures from the outer side only. An exemplary photoresist 224 is used to form the modified hard mask fin structures 222. For example, the photoresist 224 may protect portions of the hard mask fin structures that are not to be etched.

In FIG. 17D, modified hard mask fin structures 232 include an asymmetric jog 236. The asymmetric jog 236, as illustrated by opposing arrows oriented in different directions along the X-axis, includes narrowing of the width of the hard mask fin structures from both sides (e.g., at non-overlapping points in the X-direction). In FIG. 17D, the asymmetric jogs 236, across neighboring hard mask fin structures, are aligned in the Y-direction such that the resulting combined pattern is symmetrical about the X-axis. An exemplary photoresist 234 is used to form the modified hard mask fin structures 232. For example, the photoresist 234 may protect portions of the hard mask fin structures that are not to be etched.

In FIG. 17E, modified hard mask fin structures 242 include a staggered jog 246. The staggered jog 246 includes an asymmetric jog in combination with an inner jog that extends over only a middle portion of the hard mask fin structures in the X-direction. In FIG. 17E, the asymmetric jogs, across neighboring hard mask fin structures, are not aligned in the Y-direction such that the resulting pattern is staggered in the X-direction. In FIG. 17E, the inner jogs, across neighboring hard mask fin structures, are aligned in the Y-direction such that the resulting pattern defines a square-shaped trench between the neighboring hard mask fin structures. An exemplary photoresist 244 is used to form the modified hard mask fin structures 242. For example, the photoresist 244 may protect portions of the hard mask fin structures that are not to etched.

Though the jog geometries are described above with reference to the respective modified hard mask fin structures, the same jog geometries also apply to respective fin structures that result from etching the stack of semiconductor layers 104 according to the pattern of the modified hard mask fin structures (e.g., similar to fin structures 112 of FIGS. 6A-6C).

Embodiments of the present disclosure provide a semiconductor device structure and methods of forming the same. In some embodiments, a method includes forming a stack of semiconductor layers on a substrate, depositing a hard mask over the stack of semiconductor layers, forming, over the hard mask, a first photoresist layer that defines first openings that expose portions of the hard mask that are to be etched, etching the portions of the hard mask to form a hard mask fin structure, forming, over a first portion of the hard mask fin structure, a second photoresist layer that defines a second opening that exposes a second portion of the hard mask fin structure that is to be etched, etching the second portion of the hard mask fin structure to form a modified hard mask fin structure, and etching portions of the stack of semiconductor layers to form a fin structure.

Another embodiment is a method. The method includes forming a hard mask fin structure over one or more semiconductor layers, and the hard mask fin structure has a varying width along a first direction. The method further includes removing portions of the one or more semiconductor layers to form a fin structure, and the fin structure has a varying width along the first direction. The method further includes depositing an insulating layer adjacent the fin structure, forming a first sacrificial gate structure over a portion of the fin structure, and the first sacrificial gate structure extends in a second direction substantially perpendicular to the first direction. The method further includes recessing exposed portions of the fin structure to expose a portion of a substrate and forming a first source/drain region on the exposed portion of the substrate. The source/drain region has a varying width along the first direction.

A further embodiment is a structure. The structure includes a first gate electrode layer disposed over a substrate, and the first gate electrode layer extends in a first direction. The structure further includes a second gate electrode layer disposed over the substrate, and the second gate electrode layer extends in the first direction. The structure further includes a first source/drain region disposed on a first side of the first gate electrode layer, and the first source/drain region has a first constant width along a second direction substantially perpendicular to the first direction. The structure further includes a second source/drain region disposed on a second side of the first gate electrode layer opposite the first side, and the second source/drain region has a varying width along the second direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:

forming a stack of semiconductor layers on a substrate;

depositing a hard mask over the stack of semiconductor layers;

forming, over the hard mask, a first photoresist layer that defines first openings that expose portions of the hard mask that are to be etched;

etching the portions of the hard mask to form a hard mask fin structure;

forming, over a first portion of the hard mask fin structure, a second photoresist layer that defines a second opening that exposes a second portion of the hard mask fin structure that is to be etched;

etching the second portion of the hard mask fin structure to form a modified hard mask fin structure; and etching portions of the stack of semiconductor layers to form a fin structure; wherein the fin structure extends lengthwise in a first direction, the fin structure has a varying width in a second direction substantially perpendicular to the first direction.

2. The method of claim 1, wherein the first portion of the hard mask fin structure is protected by the second photoresist layer during the etching of the second portion of the hard mask fin structure.

3. The method of claim 1, further comprising forming first and second sacrificial gate structures over the fin structure.

4. The method of claim 3, wherein the fin structure comprises a first portion having a first width, a second portion having a second width, and a transition portion between the first and second portions of the fin structure, and wherein the transition portion is located between the first and second sacrificial gate structures.

5. The method of claim 3, further comprising forming a first source/drain (S/D) region between the first and second sacrificial gate structures.

6. The method of claim 5, wherein the first S/D region includes different widths in a top view.

7. The method of claim 1, further comprising forming a second S/D region and a third S/D region, wherein the first sacrificial gate structure is between the first and second S/D regions, and the second sacrificial gate structure is between the first and third S/D regions.

8. The method of claim 7, wherein the third S/D region has a width greater than a width of the second S/D region in a top view.

9. A method, comprising:

forming a hard mask fin structure over one or more semiconductor layers, wherein the hard mask fin structure has a varying width along a first direction;

removing portions of the one or more semiconductor layers to form a fin structure, wherein the fin structure has a varying width along the first direction;

depositing an insulating layer adjacent the fin structure;

forming a first sacrificial gate structure over a portion of the fin structure, wherein the first sacrificial gate structure extends in a second direction substantially perpendicular to the first direction;

recessing exposed portions of the fin structure to expose a portion of a substrate; and forming a first source/drain region on the exposed portion of the substrate, wherein the first source/drain region has a varying width along the first direction.

10. The method of claim 9, further comprising forming a second source/drain region, wherein the first source/drain region is formed on one side of the first sacrificial gate structure, and the second source/drain region is formed on an opposite side of the first sacrificial gate structure.

11. The method of claim 10, wherein the second source/drain region has a first constant width along the first direction.

12. The method of claim 11, further comprising:

forming a second sacrificial gate structure; and forming a third source/drain region, wherein the first source/drain region is formed on one side of the second sacrificial gate structure, and the third source/drain region is formed on an opposite side of the second sacrificial gate structure.

13. The method of claim 12, wherein the third source/drain region has a second constant width along the first direction, wherein the second constant width is substantially greater than the first constant width.

14. The method of claim 12, wherein the fin structure comprises a first portion having a first width, a second portion having a second width substantially greater than the first width, and a transition portion located between the first and second portions.

15. The method of claim 14, wherein the transition portion is located between the first and second sacrificial gate structures.

16. A method, comprising:

forming a fin structure, wherein the fin structure has a varying width along a first direction;

forming a first sacrificial gate structure over a first portion of the fin structure and a second sacrificial gate structure over a second portion of the fin structure, wherein the first and second sacrificial gate structures extend in a second direction substantially perpendicular to the first direction;

recessing a third portion of the fin structure located between the first and second sacrificial gate structures to expose a portion of a substrate; and forming a source/drain region on the exposed portion of the substrate, wherein the source/drain region has a varying width along the first direction; wherein the first sacrificial gate structure comprises a first sacrificial gate electrode layer, and the second sacrificial gate structure comprises a second sacrificial gate electrode layer; wherein the first sacrificial gate electrode layer has a first dimension along the second direction, and the second sacrificial gate electrode layer has a second dimension along the second direction; wherein the first dimension is less than the second dimension.

* * * * *